(12) United States Patent
Ogura et al.

(10) Patent No.: US 6,268,990 B1
(45) Date of Patent: Jul. 31, 2001

(54) SEMICONDUCTOR PROTECTION DEVICE AND POWER CONVERTING SYSTEM

(75) Inventors: Tsuneo Ogura, Kamakura; Kimihiro Hoshi, Koganei, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/339,214

(22) Filed: Jun. 24, 1999

(30) Foreign Application Priority Data

Jun. 26, 1998 (JP) .................................................. 10-180318

(51) Int. Cl.$^7$ ....................................................... H02F 3/20
(52) U.S. Cl. ........................ 361/91.7; 361/91.5; 361/111; 327/310
(58) Field of Search ................................ 361/54, 56, 111, 361/88, 91.5, 91.7; 257/355, 356, 362; 327/306, 309, 310, 313, 327

(56) References Cited

U.S. PATENT DOCUMENTS

| | | | |
|---|---|---|---|
| 4,319,318 | * 3/1982 | Rippel et al. | 363/138 |
| 4,366,522 | * 12/1982 | Baker | 361/91 |
| 4,885,657 | * 12/1989 | Gruning | 361/91 |
| 4,914,540 | * 4/1990 | Tabata et al. | 361/91 |
| 4,924,344 | * 5/1990 | Guajardo | 361/101 |
| 5,432,471 | * 7/1995 | Majumdar et al. | 327/380 |
| 5,841,647 | 11/1998 | Hoshi . | |
| 5,883,402 | 3/1999 | Omura et al. . | |

FOREIGN PATENT DOCUMENTS

| | | |
|---|---|---|
| 7-288456 | 10/1995 | (JP) . |
| 2622524 | 4/1997 | (JP) . |

* cited by examiner

*Primary Examiner*—Michael J. Sherry
*Assistant Examiner*—Kim Huynh
(74) *Attorney, Agent, or Firm*—Oblon, Spivak, McClelland, Maier & Neustadt, P.C.

(57) ABSTRACT

A semiconductor protection device is used to suppress a surge voltage to a preset value or less, the surge voltage being caused at each turn-OFF time of 50 Hz to 20 kHz of a main IGBT functioning as a switch of a power converting system. The semiconductor protection device includes a protection IGBT for forming a bypass connected in parallel with the main IGBT and an electric field sensing element connected in a reverse direction between the collector of the main IGBT and the gate of the protection IGBT. When the surge voltage exceeds a preset value which is a breakdown voltage of the electric field sensing element, the protection IGBT is turned ON so as to cause a current generated by energy of the surge voltage to be bypassed.

23 Claims, 15 Drawing Sheets

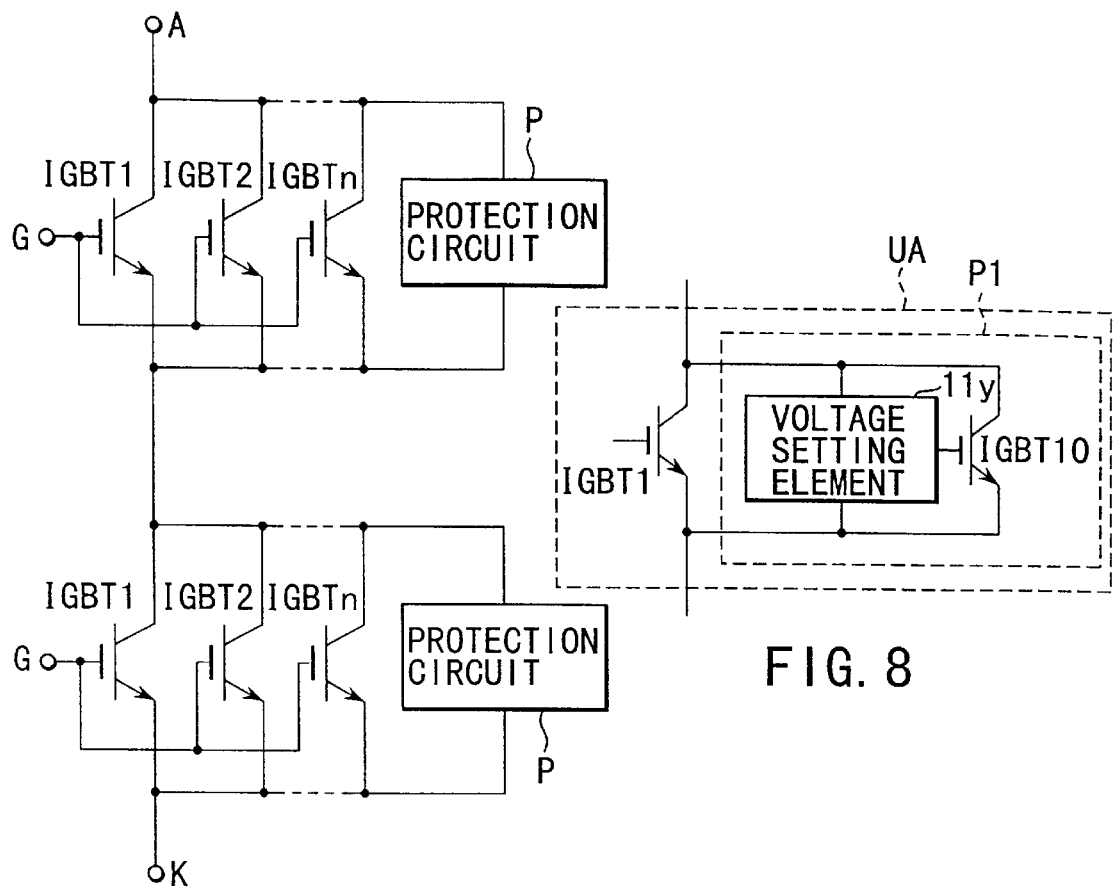
FIG. 7
FIG. 8
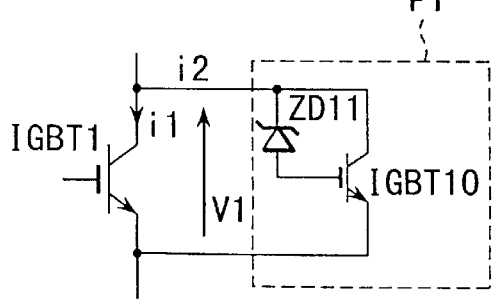
FIG. 9
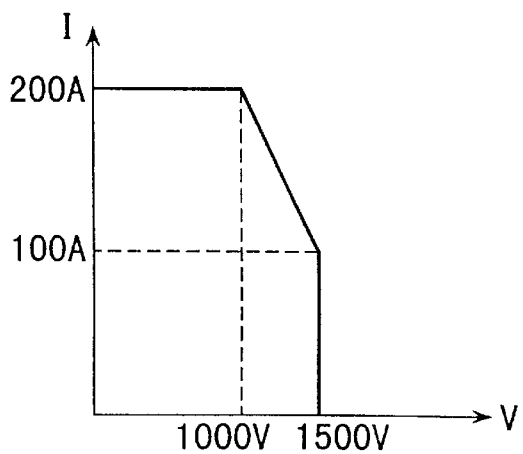
FIG. 10

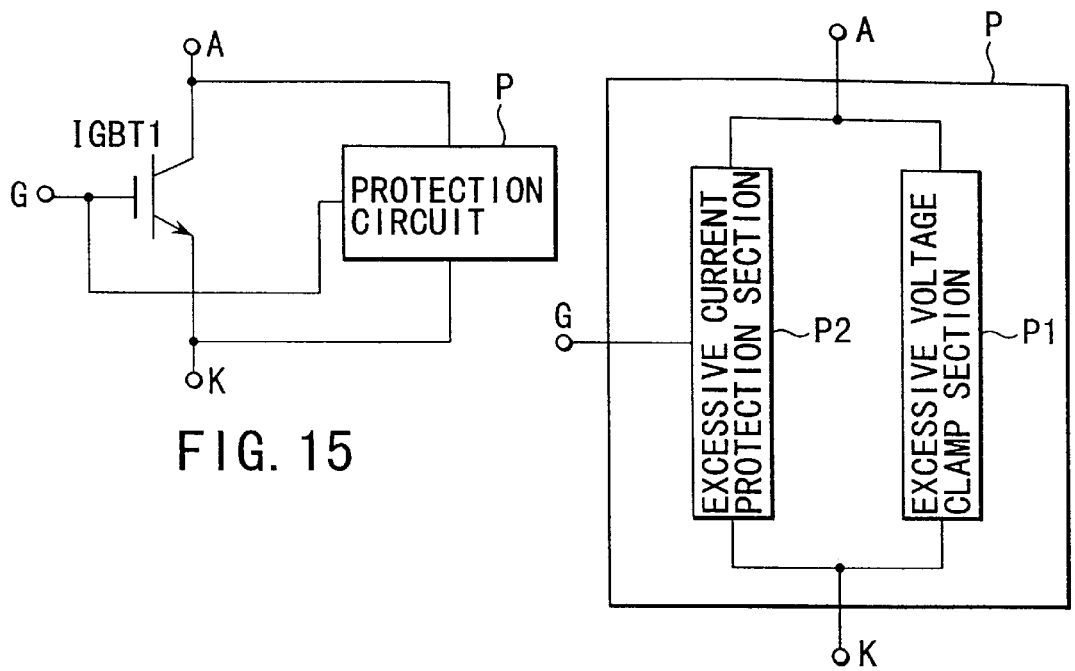
FIG. 15
FIG. 16
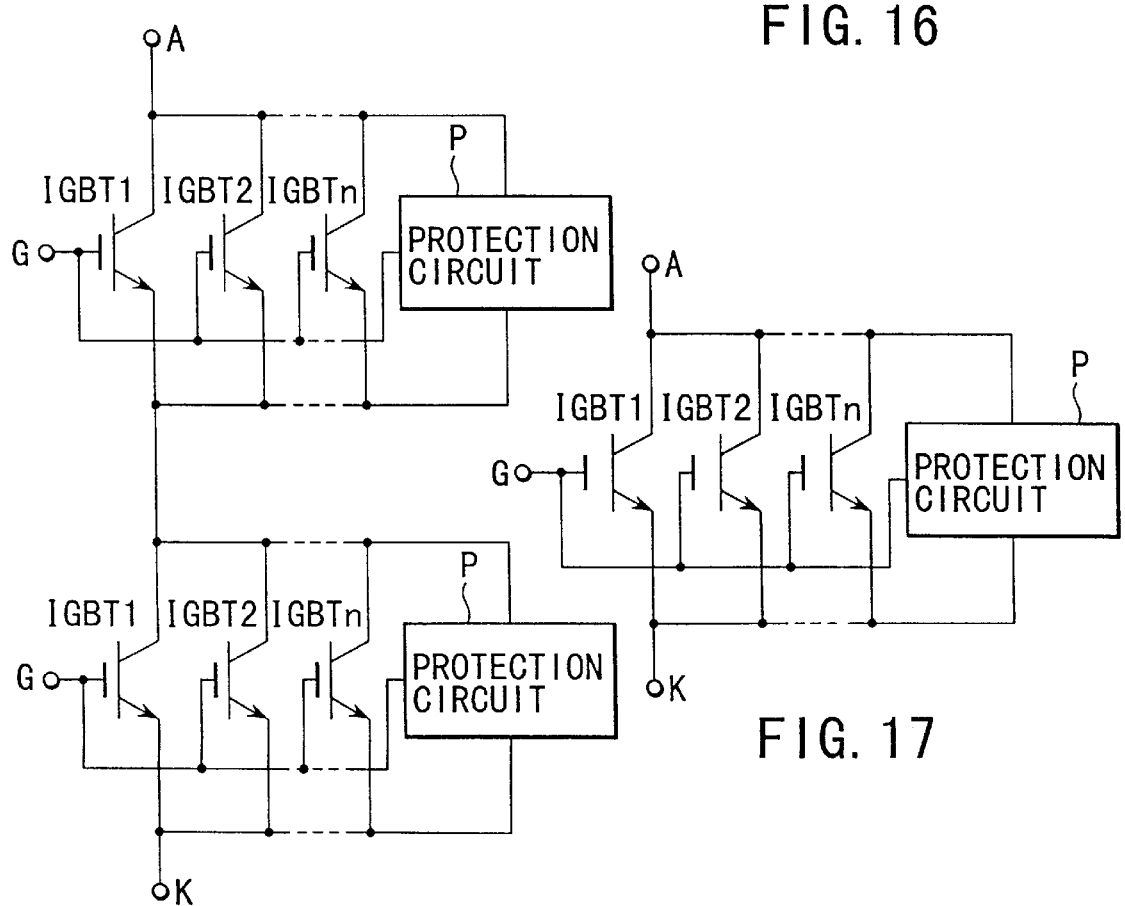
FIG. 17
FIG. 18

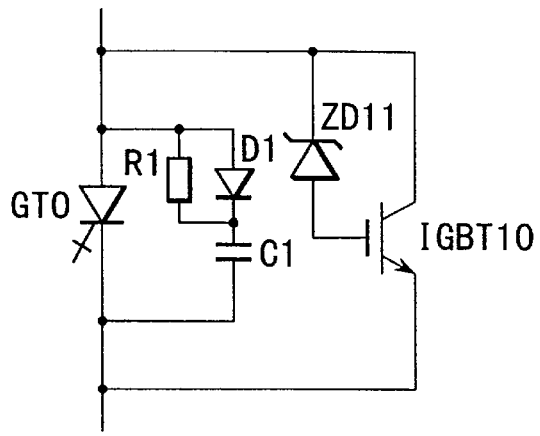
FIG. 23
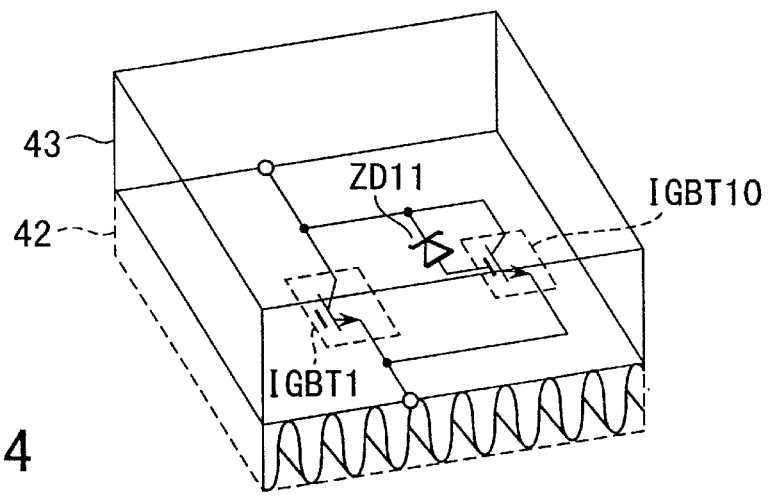
FIG. 24
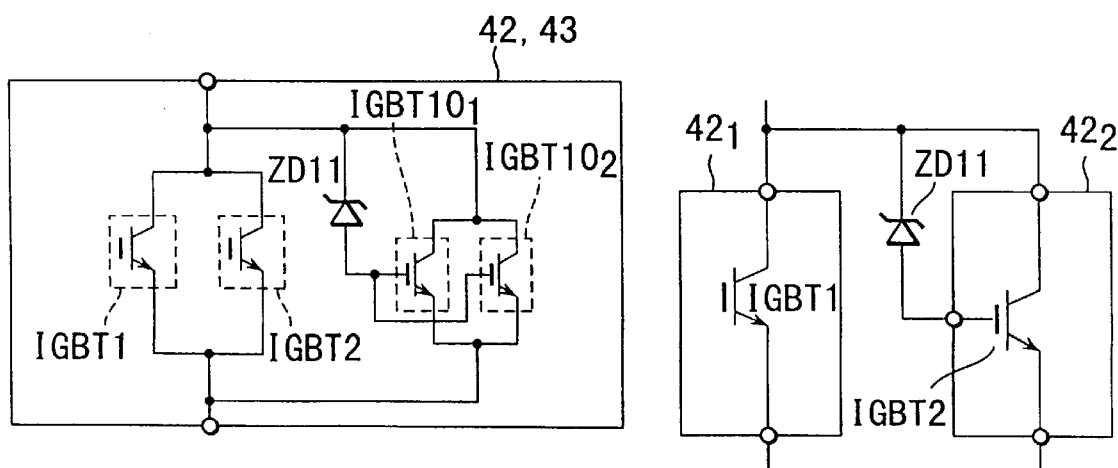
FIG. 25
FIG. 26

SEMICONDUCTOR PROTECTION DEVICE AND POWER CONVERTING SYSTEM

BACKGROUND OF THE INVENTION

The present invention relates to a semiconductor protection device for protecting a semiconductor switch which generates a surge voltage at the time of current interruption and a power converting system using the same.

As a power electronics system such as a motor driving power converting system, an inverter is known. As a switching element used in the inverter, recently, an IGBT (Insulated Gate Bipolar Transistor) is widely used. In this type of inverter, a protection circuit is used for protecting the IGBT from a surge voltage generated at the time of turn-OFF of the IGBT which is turned ON/OFF at the frequency of 50 Hz to 20 kHz.

As the above type of protection circuit, a clamp type snubber circuit (charging type RCD snubber circuit) shown in FIG. 35 is conventionally used. The clamp type snubber circuit is provided for a series circuit including a filter capacitor Cf for supplying a circuit voltage, a wiring inductance Lm and two IGBTs 1 and 2 which are used as switching elements. More specifically, series circuits including snubber capacitors C1 and C2 and snubber diodes D1 and D2 are respectively connected in parallel with the IGBTs 1 and 2. One-side ends of snubber resistors R1 and R2 are respectively connected to nodes between the capacitors C1 and C2 and the diodes D1 and D2. The other ends of the resistors R1 and R2 are respectively connected to the emitter of the IGBT 2 and the collector of the IGBT 1.

That is, the clamp type snubber circuit has a construction in which the capacitors C1 and C2 are cross-coupled and previously charged to a circuit voltage. At the turn-OFF time, energy stored in the wiring inductance Lm is discharged, and when an instantaneous excessively high voltage (which is hereinafter referred to as a surge voltage) higher than the circuit voltage is applied to the IGBTs 1 and 2, charges are stored (excessively charged) in the capacitors C1 and C2 to clamp the surge voltage. This operation occurs at each turn-OFF time. Since the energy loss corresponds to an excessively charged amount of charges, the clamp type snubber circuit has an advantage that the energy loss is small in comparison with a completely discharging type snubber circuit.

However, the surge voltage suppressing function of a snubber circuit using a capacitor, i.e., either of the completely discharging type snubber circuit and the clamp type snubber circuit, has a disadvantage that the magnitude of the generated surge voltage varies, depending on the magnitude of an interruption current. For example, a surge voltage of 400V is generated when the interruption current is 100 A as shown in FIG. 36 and a surge voltage of 800V is generated when the interruption current is 200 A as shown in FIG. 37. Thus, the surge voltage varies according to the magnitude of the interruption current.

In this case, 100 A corresponds to 100% of a normally used current area of the switching element and 200 A is an excessive current set value such as an accident current and corresponds to 200% of the normal current. In the above application method, a circuit a voltage (1000V)+surge voltage (800V)+marginal amount (200V)=2000V is used as the breakdown voltage of the element. That is, the breakdown voltage of the element becomes approximately 200% of the circuit voltage.

The above relation can be expressed by use of a reverse bias safe operating area (RBSOA) which is necessary for the characteristic of the element, as shown in FIG. 38. That is, it is necessary to safely interrupt the maximum excessive current at the circuit voltage (1000V) and safely interrupt the steady-state current at the maximum voltage (1800V). As is clearly seen from FIG. 38, the safe operation is required in an area higher than the circuit voltage (1000V). However, in the high breakdown voltage area, holes and electrons are easily generated by the avalanche breakdown so as to abruptly make it difficult to attain the safe operation. Therefore, particularly, in order to develop IGBTs which can be used in an area higher than the circuit voltage 1000V, some restrictions for reducing the current used are required, for example.

Further, the clamp type snubber circuit has a cross-coupled wiring and cannot be applied to a circuit in which one arm includes serially connected two or more IGBTS. Therefore, in a high voltage converting system having a plurality of IGBTs serially connected, there is a problem in that a usable snubber circuit of small loss is not realized, but, as a result, a non-charging type snubber of large loss is used.

On the other hand, there is a circuit system having a combination of a snubber circuit and a protection circuit against the excessive voltage, as shown in FIG. 39. The operation of the above circuit is explained with reference to FIGS. 40 and 41.

First, if IGBTs 1 and 2 interrupt a normal current i1 (=100 A at maximum), a surge voltage is generated and it is suppressed to V1 (=1400V at maximum) by a clamp snubber. V1 is suppressed to 150% (=1500V) of the circuit voltage at maximum if the normal current i1 is interrupted. However, if an excessively large current ioc (=200 A at maximum) generated at the time of accident of load short circuit is interrupted, a high surge voltage (1800V) is generated in the clamp snubber circuit. Therefore, it reaches an excessive voltage protection level Vzd (for example, 170% of the circuit voltage=1700V) and is clamped at Vzd, as shown in FIG. 41.

Thus, the element breakdown voltage in a case where the temporary excessive voltage protection circuit of FIG. 39 is attached becomes 1700V+marginal amount 200V=1900V. In this case, an element whose breakdown voltage is lower than the element breakdown voltage 2000V, attained when only the clamp snubber circuit of FIG. 35 is used, can be used, but the difference in the breakdown voltage is small. Since electric energy indicated by the oblique line in the voltage suppressing period is discharged at the turn-ON condition, a current of an amount larger than that of the current flowing at the normal turn-OFF time flows as shown in FIG. 41. Like the case of FIG. 38, the RBSOA of this case is required so that the steady-state current can be safely interrupted at the time of maximum voltage 1700V, and therefore, significant improvement cannot be expected.

Further, an excessive voltage protection circuit different from the excessive voltage protection circuit shown in FIG. 39 is disclosed in Japanese Patent No. 2622524 and Jpn. Pat. Appln. KOKAI Publication No. 7-288456. In the construction disclosed in the above publications, an auxiliary switching element such as an FET or IGBT is connected in parallel with a main switching element and an excessive voltage sensor is provided for the auxiliary switching element. If an excessive voltage is applied, the auxiliary switching element is operated to protect the main switching element from the excessive voltage.

However, the protection method in the above cases is the same as that used in the conventional construction shown in FIGS. 40 and 41 and no improvement can be expected from the viewpoint of utilization factor of the element breakdown voltage. That is, an excessive voltage protection level which is sufficiently higher (for example, 170% as explained in the former case) than the circuit voltage is set and a design is made such that the surge voltage does not exceed the level. Further, the significant improvement cannot be expected from the viewpoint of the RBSOA.

Further, in a case where IGBTs 1 and 2 are connected in parallel instead of using the single IGBT, the characteristics of the IGBTs 1 and 2 are different from each other and the currents flowing therethrough are unbalanced. At this time, a high surge voltage is applied to the snubber circuit by one of the IGBTs which interrupts a larger current. Further, if the IGBTs 1 and 2 are connected in series, surge voltages generated in the IGBTs 1 and 2 at the turn-OFF time become unbalanced and an excessively high surge voltage is applied to one of the IGBTs.

As describe d above, in the conventional snubber circuit, since the surge voltage becomes high in proportion to the magnitude of the in terruption current, the utilization factor of the voltage of the main IGBT is lowered according to the margin for destruction by the excessive voltage. That is, no problem occurs when the interruption current is small as shown in FIG. 36, but when the interruption current is large as shown in FIG. 37, the breakdown voltage is 2000V with respect to the circuit voltage 1000V and the utilization factor is lowered to approx. 50%. Likewise, in a case shown in FIG. 41, the element breakdown voltage is 1900V while the circuit voltage is 1000V and the utilization factor becomes 52.6% and can be enhanced only by 2.6%.

From the viewpoint of the RBSOA, it is required to safely turn OFF the element at a high voltage of 800V or 700V with respect to the circuit voltage 1000V. Further, in the snubber circuit, since the external dimensions of the capacitor and resistor are large, the external dimension of the capacitor becomes extremely large and it becomes difficult to cool the resistor when the breakdown voltage becomes high.

Further, there is a problem that a clamp type snubber circuit of small loss for series connection is not present. Also, there occurs a possibility that surge voltages generated at the time of interruption of the current flowing in the series-connected IGBTs will not be uniformly generated in the respective IGBTs and an excessive voltage is applied to one of the IGBTs to destroy the IGBT.

If the main IGBTs are connected in series or in parallel, the voltages or currents thereof occurring at the switching time become unbalance depending on the characteristics of the main IGBTs. In order to eliminate the unbalanced state, it is required to set the characteristics of the main IGBTs equal. This lowers the yield of the IGBTs and raises the cost thereof.

Further, if the voltages become unbalance at the time of switching of the main IGBT, it becomes difficult to standardize the main IGBT and the peripheral circuit thereof. In this case, it becomes necessary to select the main IGBT and snubber circuit each time the power converting system is formed and the cost thereof may be raised.

BRIEF SUMMARY OF THE INVENTION

An object of the present invention is to provide a semiconductor protection device capable of making a surge voltage constant irrespective of the magnitude of an interruption current and protecting a main semiconductor switch (or main switching element).

Another object of the present invention is to provide a semiconductor protection device having an external dimension smaller than the conventional snubber circuit.

Still another object of the present invention is to provide a semiconductor protection device capable of eliminating the voltage unbalance at the switching time irrespective of the characteristics of the main switching elements even when the main switching elements are connected in series or in parallel.

Still another object of the present invention is to provide a semiconductor protection device capable of making a surge voltage constant and using a main switching element which has a less marginal amount with respect to the circuit voltage (that is, in which the utilization factor of the voltage of the main switching element can be enhanced or an area for RBSOA is not necessary up to a voltage which is sufficiently high with respect to the circuit voltage).

Still another object of the present invention is to provide a power converting system using a semiconductor protection device having any one of the above-described characteristics.

The gist of the present invention lies in that a protection circuit having an excessive voltage clamp section for suppressing the excessive voltage occurring at each normal turn-OFF time is formed by employing a circuit for detecting an excessive voltage and a switching element which is turned ON/OFF according to the result of detection, and the protection circuit is connected in parallel with a main semiconductor switch (main switching element).

With the above construction, the excessive voltage clamp section suppresses the surge voltage to a preset value or less at each turn-OFF time. Thus, it becomes as possible to make constant the maximum value of the surge voltage applied to the main switching element irrespective of the characteristic of the main switching element.

If the maximum value of the surge voltage is suppressed to 50% or less of the circuit voltage, the maximum value of the voltage applied to the main switching element can be suppressed to 150% or less of the circuit voltage. Therefore, the element breakdown voltage can be lowered and the utilization factor of the voltage of the main switching element can be enhanced. Further, the RBSOA can be used in an area of 150% or less of the circuit voltage, thereby making it possible to more safely use the main switching element.

Further, since the protection circuit is so constructed as to discharge the excessive voltage energy by use of the switching element, the external dimension thereof can be reduced in comparison with the conventional snubber circuit using the capacitor.

According to a first aspect of the present invention, there is provided a semiconductor protection device for suppressing a surge voltage to a preset value or less, the surge voltage occurring at each turn-OFF time of a main semiconductor switch having first and second main electrodes and a control electrode, the protection device comprising:

a switching element for forming a bypass which is connected in parallel with the main semiconductor switch and opened/closed depending on the preset value of the surge voltage, the switching element having first and second terminals arranged to be respectively connected to the first and second main electrodes and a control terminal for controlling conduction of a path between the first and second terminals; and a voltage setting element connected to the control terminal, for setting the preset value of the surge voltage, the voltage setting element applying a voltage caused by energy of the surge voltage to the control terminal when the surge voltage exceeds the preset value, and making the path between the first and second terminals conductive to cause a current generated by energy of the surge voltage to flow in the bypass.

According to a second aspect of the present invention, there is provided a power converting system comprising a plurality of switching circuits connected in parallel or in series, each of the switching circuits comprising:

a main semiconductor switch having first and second main electrodes and a control electrode; and the semiconductor protection device according to the first aspect, for suppressing a surge voltage to a preset value or less, the surge voltage occurring at each turn-OFF time of the main semiconductor switch.

In the present invention, when an excessive voltage (surge voltage) which jumps to a voltage higher than the circuit voltage by energy discharged from the wiring inductance is generated at the time of turn-OFF of the main semiconductor switch, the semiconductor protection device suppresses the surge voltage to a preset value or less and a current generated by the surge energy of the suppressed surge voltage is caused to flow as a bypass current. Therefore, the application voltage can be suppressed to a preset value, for example, the circuit voltage or less to protect the main semiconductor switch from being destroyed by the excessive voltage. Further, even when a plurality of main switching elements are connected in series or in parallel, the voltage unbalance at the switching time can be eliminated irrespective of the characteristics of the main switching elements, because the application voltage is suppressed to the preset value or less.

In the case of the switching element of the semiconductor protection device is a MOS gate type to be used in an unsaturated area by gate control, the external dimension thereof can be reduced in comparison with the conventional snubber circuit using the capacitor. If the preset value of the surge voltage is set to 100 to 150% of the power-supply voltage, a main switching element of low breakdown voltage having a small margin with respect to the circuit voltage can be used and the utilization factor of the voltage of the main switching element can be enhanced.

As a voltage setting element of the semiconductor snubber, a Zener diode or electric field sensing element can be used. Since the electric field sensing element does not utilize a local current conduction accompanied by a negative resistance due to an avalanche phenomenon, occurrence of noise can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a construction diagram showing a modification of the first embodiment;

FIG. 8 is a construction diagram showing the construction of part of a power converting system according to a second embodiment of the present invention;

FIG. 9 is a circuit diagram showing the device according to the second embodiment;

FIG. 10 is a diagram for illustrating the safe operating area in the second embodiment;

FIG. 15 is a construction diagram showing the construction of part of a power converting system according to a fourth embodiment of the present invention;

FIG. 16 is a construction diagram showing a protection circuit in the fourth embodiment;

FIG. 17 is a construction diagram showing a modification of the fourth embodiment;

FIG. 18 is a construction diagram showing another modification of the fourth embodiment;

FIG. 23 is a circuit diagram showing part of a power converting system according to a seventh embodiment of the present invention;

FIG. 24 is a schematic perspective view showing part of a power converting system according to an eighth embodiment of the present invention;

FIG. 25 is a construction diagram showing a modification of the eighth embodiment;

FIG. 26 is a circuit diagram showing part of a power converting system according to a ninth embodiment of the present invention;

DETAILED DESCRIPTION OF THE INVENTION

Figure 1:
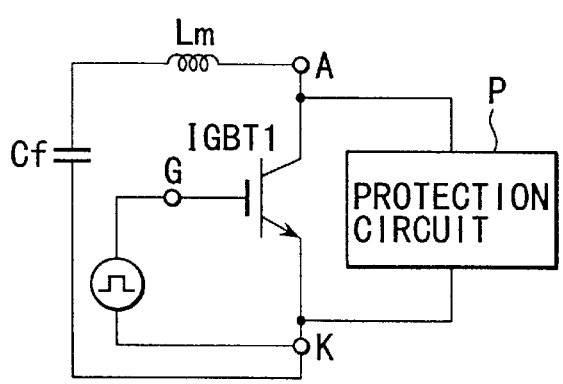
FIG. 1 is a construction diagram showing part of a power converting system according to a first embodiment of the present invention.

There will now be described embodiments of the present invention with reference to the accompanying drawings. In this specification, constituents which have substantially the same function and construction are denoted by the same reference numerals and repetitive explanation is made only when necessary.

(First Embodiment)

Figure 2:
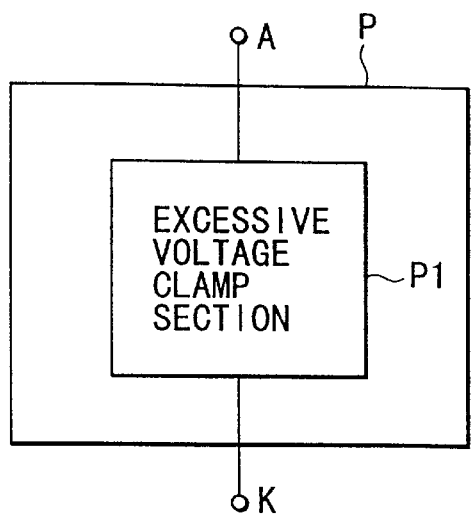
FIG. 2 is a construction diagram showing a protection circuit according to the first embodiment.

FIG. 1 is a construction diagram showing part of a power converting system according to a first embodiment of the present invention and FIG. 2 is a construction diagram showing a protection circuit of the device.

In FIG. 1, a filter capacitor Cf for supplying a circuit voltage, a wiring inductance Lm and an IGBT 1 used as a main switching element are shown. The protection circuit P is connected between an anode terminal A and a cathode terminal K of the device so as to be connected in parallel with the IGBT 1. As shown in FIG. 2, the protection circuit P has an excessive voltage clamp section P1 connected between the anode terminal A and the cathode terminal K.

Next, the operation of the above semiconductor device is explained.

Figure 3:
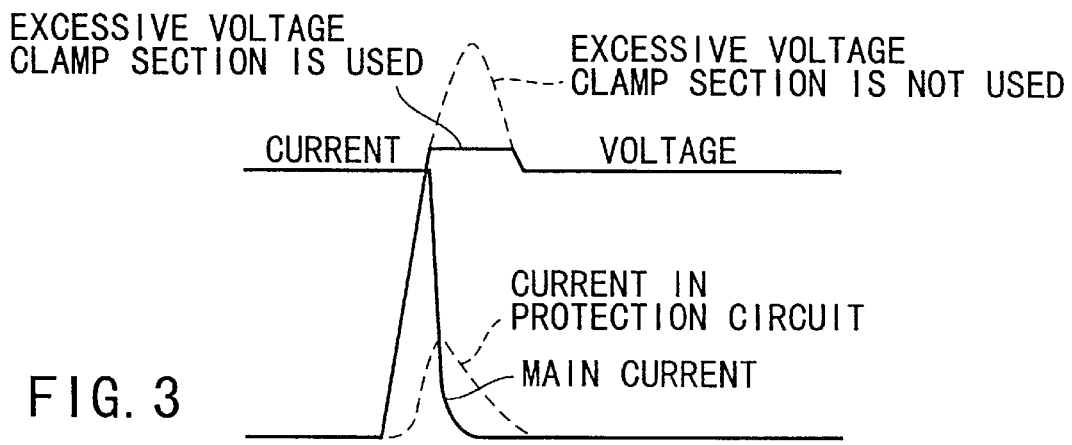
FIG. 3 is a waveform diagram for illustrating the operation of the first embodiment.

In the ON state, a main current flows in the IGBT 1 and no current flows in the excessive voltage clamp section P1. If the IGBT 1 is turned OFF, part of the main current is divided and flows as a protection circuit current in the excessive voltage clamp section P1 when and after the application voltage becomes equal to or higher than the circuit voltage by energy discharged from the wiring inductance Im as shown in FIG. 3. Further, the remaining part of the main current continues to flow in the IGBT 1. As a result, since the application voltage is clamped at each turn-OFF time, the safety of the turn-OFF operation can be enhanced as the whole semiconductor device.

When the IGBT 1 is turned OFF, an excessive voltage (surge voltage) which is rapidly raised over the circuit voltage by energy discharged from the wiring inductance Lm is generated. At this time, a bypass current can be caused to flow by setting the excessive voltage clamp section P1 into the ON state. Therefore, the voltage applied to the IGBT 1 is suppressed to a preset value, for example, the circuit voltage or less so as to protect the main switching element or IGBT (which is also referred to as a main IGBT) from being destroyed by the excessive voltage. Since the application voltage is suppressed to the preset value or less, occurrence of the voltage unbalance at the switching time can be prevented irrespective of the characteristics of the main switching elements even when the IGBTs or the main switching elements are connected in series or in parallel.

Figure 4:
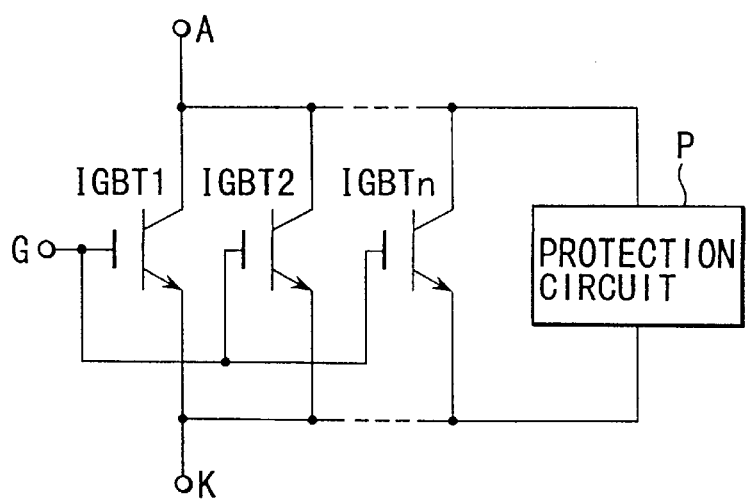
FIG. 4 is a construction diagram showing a modification of the first embodiment.

According to the above embodiment, since the protection circuit P having the two terminals, i.e., the anode terminal A and cathode terminal K, is used as the excessive voltage clamp section P1, it can be easily integrated with the IGBT or the main switching element. For example, as shown in FIG. 1, the protection circuit P can be directly connected in parallel with the main IGBT 1. Further, as shown in FIG. 4, it can be connected in parallel with a plurality of main IGBTs 1 to n to protect all of the main IGBTs 1 to n. The constructions which are the same as that shown in FIG. 4 can be connected in series as shown in FIG. 7.

Figure 5:
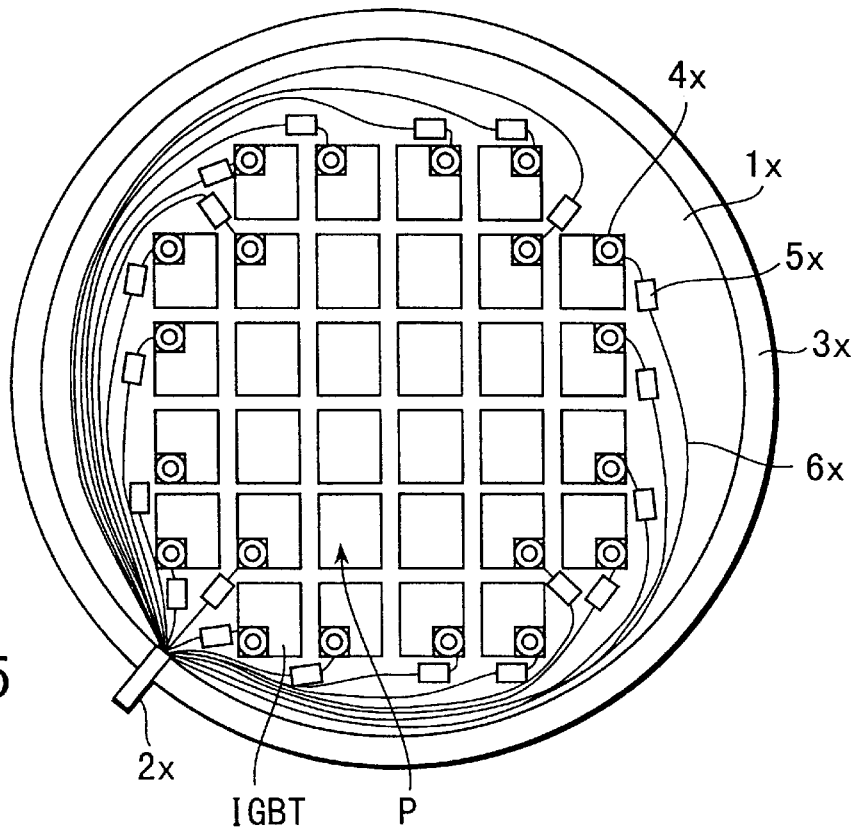
FIG. 5 is a plan view showing a cathode electrode of a pressure-bonding type semiconductor device according to the first embodiment as viewed within the package.

The semiconductor device including the protection circuit P and main IGBTs 1 to n can be put into a package. For example, FIG. 5 is a plan view showing a cathode electrode of a packaged pressure-bonding type semiconductor device as viewed within the package. The cathode electrode 1x is surrounded by an insulating envelop 3x for supporting a gate terminal 2x. Inside the envelop, a plurality of spring pins 4x pressed against and set into contact with gate pads of semiconductor chips (including at least one chip for the protection circuit P and n chips for the main IGBTs 1 to n) on the anode electrode (not shown) are arranged. The spring pin 4x for the protection circuit chip is removed in advance. The spring pins 4x are connected to the gate terminal 2x via a plurality of lead wires 6x each including a gate resistor 5x. Thus, a module type semiconductor device can be realized by arranging the chips for the IGBTs 1 to ja and the protection circuit chip P on the same plane and putting them into a package.

Figure 6:
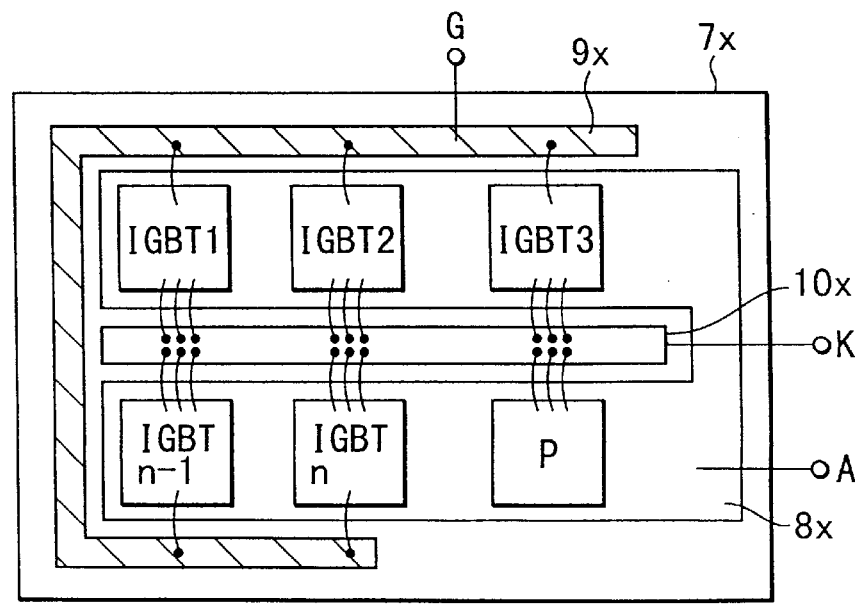
FIG. 6 is a schematic view showing a package structure of another semiconductor device according to the first embodiment.

FIG. 6 is a schematic view showing the package structure of another module type semiconductor device. In this structure, an insulating substrate 7x formed of resin or ceramic and having an opening formed inside the envelop or in the semiconductor chip arranging portion is arranged on an anode electrode plate 8x. A gate electrode wiring 9x thinly vapor-deposited on the insulating substrate 7x and the gate pads of the IGBTs 1 to n are bonding-connected via wires. A cathode electrode wiring 10x vapor-deposited on the insulating substrate 7x and the cathodes of the IGBTs 1 to n and protection circuit chip P are connected via wires.

(Second Embodiment)

FIG. 8 is a construction diagram showing part of a power converting system according to a second embodiment of the present invention.

This embodiment relates to a specific construction of the excessive voltage clamp section P1. As shown in FIG. 8, a semiconductor device UA includes a main IGBT 1 and an excessive voltage clamp section P1. The excessive voltage clamp section P1 includes an excessive voltage clamping switching element or IGBT 10 and a voltage setting circuit 11y connected between the anode terminal A and the cathode terminal K of the protection circuit P and connected to the gate of the IGBT 10.

The voltage setting circuit 11y has a function of detecting the magnitude of an application voltage in a range of the breakdown voltage of the main IGBT 1 or less. For example, as shown in FIG. 9, the voltage setting circuit 11y may include a Zener diode ZD11 connected in a reverse direction between the collector of the main IGBT 1 and the gate of the protection IGBT 10. In this case, the voltage setting circuit 11y detects the magnitude of the application voltage with reference to the Zener voltage and is broken down when a voltage higher than the Zener voltage is applied in the reverse direction. The Zener voltage is set to approx. 75% of the breakdown voltage of the main IGBT 1 and the voltage of a filter capacitor Cf used as the circuit voltage is set at approx. 60% of the breakdown voltage of the main IGBT 1.

The reason why the Zener voltage is set to 75% is explained below.

In the case of the conventional capacitor type snubber circuit, a surge voltage increases in proportion to the magnitude of an interruption current. For example, assume that the breakdown voltage of the main IGBT 1 is 4.5 kV, the maximum interruption current is 3 kA, the main circuit inductance Lm is 1 $\mu$H and the snubber capacitance C1 is 3 $\mu$F. In this case, the surge voltage $\Delta$V generated when the maximum interruption current is interrupted becomes 1.73 kV based on the following equation. Therefore, the voltage applied to the IGBT becomes (2.25 kV+1.73 kV)×3.98 kV (approx. 88.5% of the breakdown voltage).

$$\Delta V \times 3\ kA \cdot (Lm/C1)^{1/2} = 3\ kA \cdot (1\ \mu H/3\ \mu F)^{1/2} = 1.73\ kV$$

In this case, in the conventional capacitor type snubber circuit, the circuit voltage is set to approx. 50% of the breakdown voltage of the main IGBT 1 by taking the margin into consideration and the normal interruption current is set to 1.5 kA or less. The surge voltage $\Delta$V generated when the interruption current of 1.5 kA is interrupted becomes 0.87 kV based on the following equation. Therefore, the voltage applied to the main IGBT 1 becomes 3.12 kV (approx. 69% of the breakdown voltage).

$$\Delta V = 1.5\ kA \cdot (1\ \mu H/3\ \mu F)^{1/2} = 0.87\ kV$$

If a voltage variation of 10% of the circuit voltage is taken into consideration, the voltage applied to the IGBT 1 becomes (2.25 kV×1.1+0.87 kV)=3.345 kV (74.3% of the breakdown voltage) and becomes approx. 75% of the breakdown voltage of the main IGBT 1. That is, conventionally, the application voltage containing the surge voltage at each turn-OFF time is set to 75% of the breakdown voltage or less.

Therefore, conventionally, a preset suppressing value exceeding 75% of the breakdown voltage is set for a temporary excessive voltage occurring at the time of accident, for example. Further, the surge voltage occurring at each turn-OFF time of the normal operation is suppressed by use of the capacitor type snubber circuit. Therefore, the circuit voltage which is as low as 50% of the breakdown voltage of the main IGBT 1 is used.

On the other hand, in the present invention, the suppressing value (Zener voltage) of the temporary excessive voltage is set to 75% of the breakdown voltage or less and the surge voltage at each normal turn-OFF time is also suppressed by use of the set value. In this respect, the present invention is clearly different from the prior art technique.

In the above explanation made based on the element breakdown voltage, the magnitude of the set value (suppressed value) is described in comparison with the breakdown voltage of the main IGBT 1. If it is compared with the circuit voltage and when the circuit voltage is set to 50% of the breakdown voltage, the preset value which is 75% of the breakdown voltage corresponds to 150% (75%/50%) of the circuit voltage. Likewise, when the circuit voltage is set to 60% of the breakdown voltage, for example, the preset value corresponds to 125% (75%/60%) of the circuit voltage.

Further, it is possible to set the circuit voltage to 80% of the breakdown voltage and set the preset value to 90% of the breakdown voltage, and in this case, the preset value becomes 112.5% of the circuit voltage. That is, the load of the snubber circuit becomes heavier as the preset value becomes lower than 150% of the circuit voltage and becomes closer to 100% thereof, but the voltage utilization factor of the element is enhanced.

Figure 38:
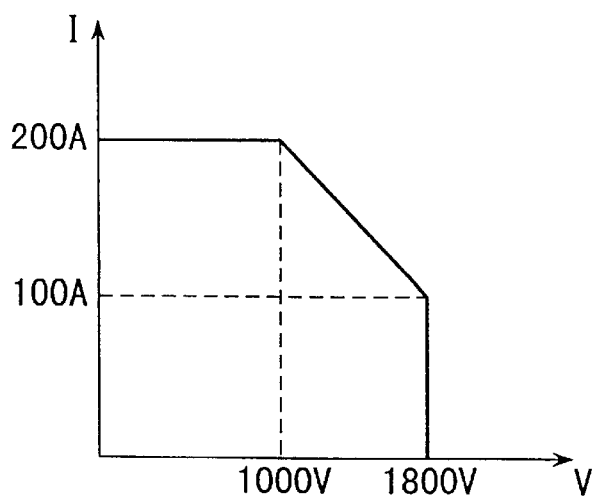
FIG. 38 is a diagram showing the safely operating area of the conventional clamp type snubber circuit.
Figure 39:
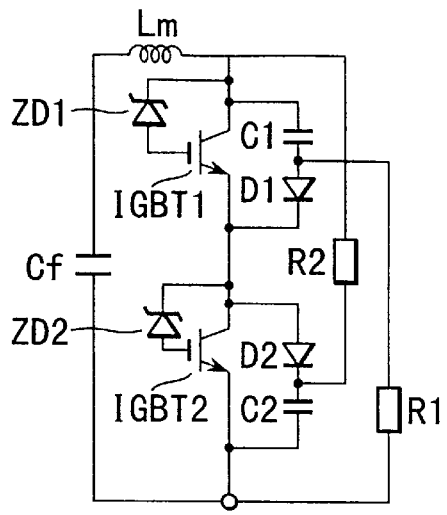
FIG. 39 is a circuit diagram showing the construction of a combination of the conventional snubber circuit and an excessive voltage protection circuit.
Figure 40:
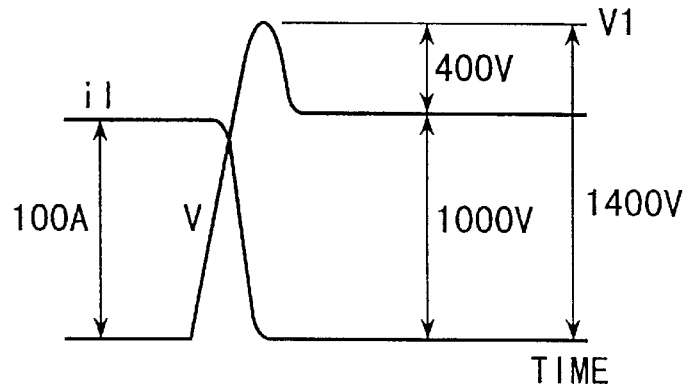
FIG. 40 is a waveform diagram for illustrating the operation of the conventional combined protection circuit.
Figure 41:
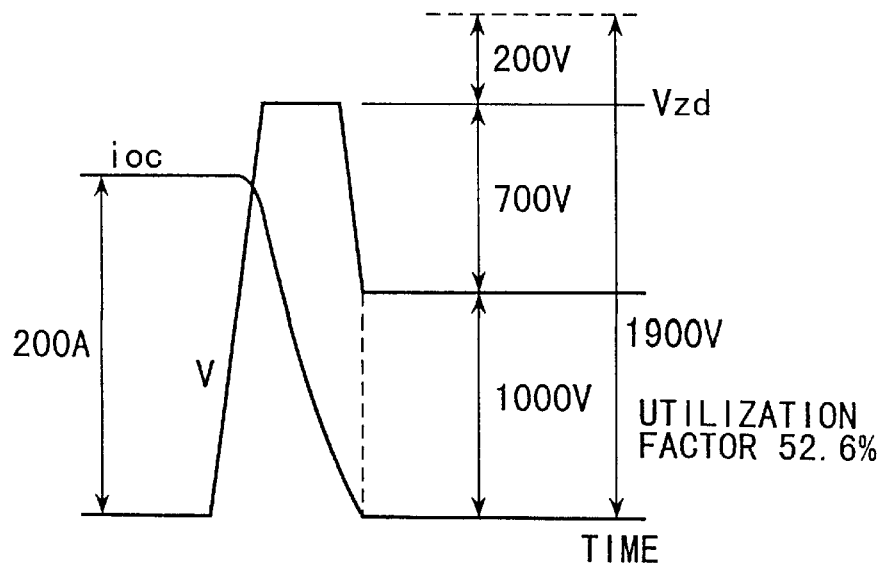
FIG. 41 is a waveform diagram for illustrating the operation of the conventional combined protection circuit.

Further, if the voltage can be suppressed so as not to exceed 150% of the circuit voltage, the switching element can be used in an area in which the RBSOA at the turn-OFF time is less than 150% of the circuit voltage. This becomes great merit in the respect that the switching element can be prevented from being destroyed. In other words, in the prior art, the maximum voltage required for interrupting the steady-state current is 1800V with respect to the circuit voltage 1000V as shown in FIG. 38, but in this embodiment, the maximum voltage required for interrupting the steady-state current is 1500V with respect to the circuit voltage 1000V as shown in FIG. 10. Therefore, a switching element having an RBSOA which satisfies the above condition can be used.

Figure 11:
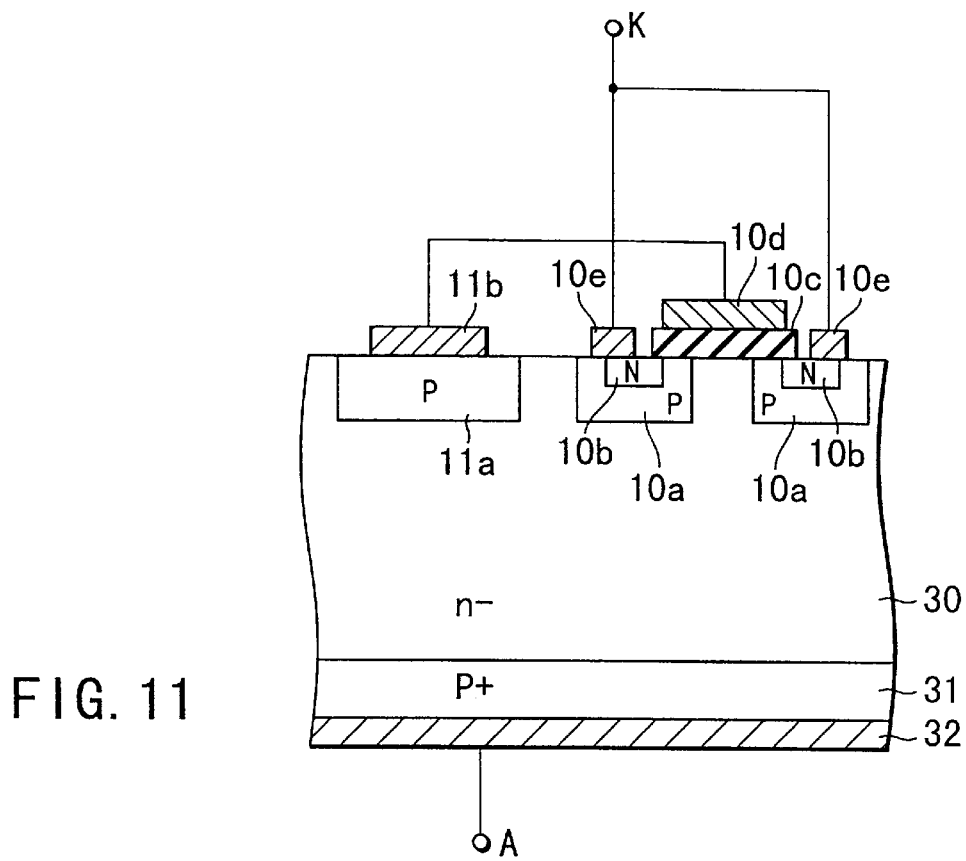
FIG. 11 is a cross sectional view showing the construction obtained in a case where a protection circuit according to the second embodiment is formed on one substrate.

FIG. 11 is a cross sectional view showing the construction obtained in a case where the protection circuit of FIG. 9 is formed on one chip.

In the excessive voltage clamp section P1 of the protection circuit, a p-emitter layer 31 and an anode electrode 32 are formed in and on one of the surfaces of an n-base layer 30, respectively. A plurality of p-base layers 10a and a p-layer 11a are selectively formed in the other surface of the n-base layer 30. An n-layer 10b is formed in the surface of each p-base layer 10a.

A gate electrode 10d of the IGBT 10 is formed on the surfaces of portions of the p-base layers 10a and n-base layer 30 which lie between the adjacent n-layers 10b with an insulating layer 10c formed therebetween. The gate electrode 10d is electrically connected to a cathode electrode 11b formed on the p-layer 11a of the Zener diode ZD11. Further, emitter electrodes 10e of the IGBT 10 which are respectively formed in contact with the p-base layers 10a and n-layers 10b are formed on both sides of the insulating layer 10c. Each of the emitter electrodes 10e is connected to a cathode terminal K of the protection circuit P.

The operation of the semiconductor device with the above construction is explained below.

Figure 12:
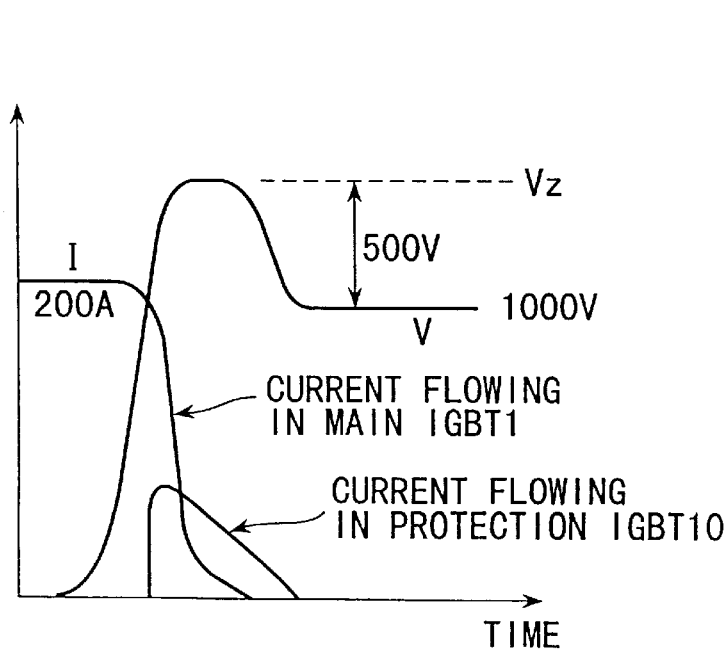
FIG. 12 is a waveform diagram for illustrating the operation of the second embodiment.

When the main IGBT 1 is set in the ON state, the gate circuit is not connected and it is not operated. If the main IGBT 1 is turned OFF, a surge voltage is generated by the wiring inductance Im. As shown in FIG. 12, if the surge voltage reaches the Zener voltage $V_Z$, the Zener diode ZD11 is broken down and a voltage is applied to the gate electrode 10d of the protection IGBT 10 to set the protection IGBT 10 into the non-saturated area. In this case, the non-saturated area indicates a state where the drain current increases with an increase in the drain voltage. As a result, as shown in FIG. 12, the protection IGBT 10 permits a current to flow while maintaining the voltage defined by the Zener voltage $V_Z$.

Thus, the surge voltage generated in the main IGBT 1 is clamped to a preset voltage corresponding to the Zener voltage $V_Z$. The clamp operation is not a temporary operation occurring at an abnormal time, but is effected for the excessive voltage at each turn-OFF time in the steady-state operation. That is, the excessive voltage generated at the turn-OFF time of the main IGBT 1 which is turned ON/OFF at 50 Hz to 20 kHz is suppressed to the preset value or less irrespective of the magnitude of the interruption current.

In the conventional snubber circuit, the surge voltage increases in proportion to the magnitude of the interruption current. Therefore, from the viewpoint that the surge voltage corresponding to the maximum value of the interruption current is suppressed to a level lower than the breakdown voltage of the main IGBT 1, it is necessary to set the circuit voltage (the voltage of the filter capacitor Cf) to a low voltage which is 50% or less of the breakdown voltage of the main IGBT 1, for example. The above setting lowers the voltage utilization factor of the main IGBT 1.

On the other hand, in this embodiment, the surge voltage can be suppressed to a preset value or less irrespective of the magnitude of the interruption current as described before. For example, if the Zener voltage is set to approx. 75% of the breakdown voltage of the main IGBT 1, the total application voltage of the surge voltage and the circuit voltage is suppressed to approx. 75% of the breakdown voltage of the main IGBT 1. Therefore, the circuit voltage can be set to a value which is as high as 75% of the breakdown voltage of the main IGBT 1. That is, the voltage utilization factor of the main IGBT 1 can be enhanced and the protection IGBT 10 and main IGBT 1 with low breakdown voltage can be used.

According to this embodiment, the effect of the first embodiment can be stably and easily attained by constructing the protection circuit by use of a combination of the IGBT 10 and Zener diode ZD11 as shown in FIG. 8. Since energy of the excessive voltage is discharged via the IGBT 10 which is used as a switching element, the external dimension can be reduced in comparison with the conventional snubber circuit using the capacitor. Further, the protection circuit in this embodiment can be formed on one chip of the semiconductor device as shown in FIG. 11. Therefore, it is suitable for a high-power converting system which requires a large number of elements of series-parallel circuits.

The excessive voltage clamp section P1 can suppress the surge voltage to the preset value or less even if the magnitude of the interruption current varies, and the preset value can be selected in the designing stage, and therefore, the labor for the element design can be reduced. Further, since the excessive voltage clamp section P1 clamps the excessive voltage in the normal operation state, the design for the breakdown voltage and RBSOA of the element becomes easier than that in the case of the conventional excessive voltage protecting system, and elements of low breakdown voltage can be used. Generally, since an element has a better characteristic as the breakdown voltage thereof is lower, the characteristic of the element used in a preset circuit can be significantly improved. Further, since the excessive voltage clamp section P1 only permits a current to flow at the voltage clamping time, for example, at the turn-OFF time, a rise in the temperature of the protection IGBT 10 can be suppressed to minimum.

This embodiment is particularly effective in enhancing the voltage utilization factor of the semiconductor switch in the power converting system using the main IGBT 1 as the semiconductor switch. However, the effect for suppressing the surge voltage occurring at each turn-OFF time to the preset value is not limited to the semiconductor switch, but can also be applied to a mechanical switch, vacuum-tube switch or gas filled switch, for example, and the effect can be expected in the pulse power field.

(Third Embodiment)

Figure 13:
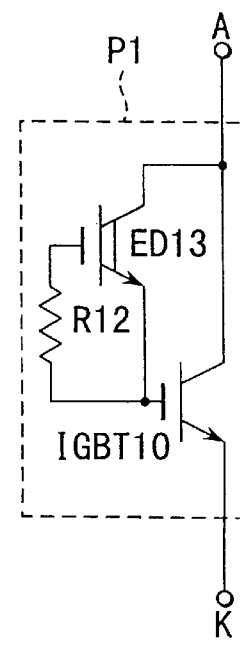
FIG. 13 is a circuit diagram showing a protection circuit according to a third embodiment.

FIG. 13 is a circuit diagram showing a protection circuit according to a third embodiment of the present invention, which is a modification of the excessive voltage clamp section P1 of FIG. 9.

The excessive voltage clamp section P1 of this modification has an electric field sensing element ED13 instead of the Zener diode ZD11. The electric field sensing element ED13 is connected between the anode terminal A of the protection circuit P and the gate of the IGBT 10 via a resistor R12. The electric field sensing element ED13 senses a voltage higher than the circuit voltage to electrically connect the anode terminal A to the gate of the IGBT 10 via the resistor R12.

Figure 14A:
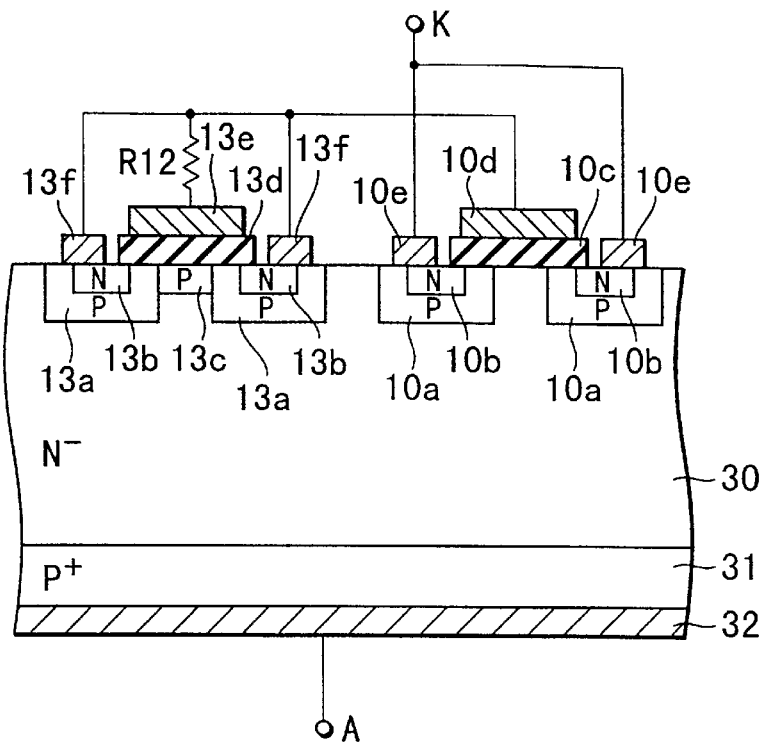
FIGS. 14A and 14B are cross sectional views showing the construction obtained in a case where the protection circuit of the third embodiment is formed on one substrate and the construction of a modification thereof.

FIG. 14A is a cross sectional view showing the construction obtained when the protection circuit of this embodiment is formed on one substrate.

In the excessive voltage clamp section P1, at least two p-base layers 13a for the electric field sensing element ED13 are selectively formed in the surface of an n-base layer 30 instead of the p-layer 11a for the Zener diode ZD11. An n-source layer 13b is selectively formed in the surface of each of the p-base layers 13a. A p-shield layer 13c is formed in the surface of a portion of the n-base layer 30 which is sandwiched between the p-base layers 13a.

The p-shield layer 13c and p-base layers 13b on both sides thereof are coupled to a gate electrode 13e via an insulating layer 13d disposed therebetween. The gate electrode 13e is connected to a gate electrode 10d of the IGBT 10 via the resistor R12. The n-source layers 13b and p-base layers 13a formed on both sides of the insulating layer 13d are connected to the resistor R12 and the gate electrode 10d of the IGBT 10 via source electrodes 13f respectively formed thereon.

The operation of the semiconductor device with the above construction is explained below.

If the voltage applied to the main IGBT 1 increases to exceed the preset value by the surge voltage, the electric field in the protection circuit P (in the n-base layer 30) becomes stronger. In this case, the electric field in the electric field sensing element ED13 rises and the p-shield layer 13c disappears to cause a capacitance between the anode electrode 32 of the electric field sensing element ED13 and the gate electrode 13e.

That is, in the electric field sensing element ED13, a depletion layer which is formed in contact with the p-shield layer 13c in the n-base layer 30 expands by a rise in the electric field, eliminates the p-shield layer 13c and reaches the insulating film 13d. Thus, the anode electrode 32 and the gate electrode 13e are coupled to each other via a capacitor having the depletion layer and insulating film 13d. As a result, the gate voltage of the gate electrode 13e abruptly rises and the polarities of the gate voltage and the voltage of the source electrode 13f are reversed.

Since the gate voltage becomes positive and a negative voltage is applied to the source electrode 13f, an n-channel layer is formed in the surface area of the p-base layer 13a sandwiched between the n-source layer 13b and the n-base layer 30. Therefore, an electron current flows into the n-base layer 30 to turn ON the MOSFET of the electric field sensing element ED13. By setting the MOSFET into the ON state, a current is caused to flow from the anode electrode 32 into the gate electrode 10d of the IGBT 10 via the electric field sensing element ED13 to raise the gate voltage of the IGBT 10. As a result, the IGBT 10 is turned ON to cause a current to flow in the protection circuit and protect the main switching element or IGBT from the a excessive voltage.

According to this embodiment, the electric field sensing element ED13 is used instead of the Zener diode ZD11. Therefore, local current conduction accompanied by the negative resistance due to the avalanche phenomenon is not used and occurrence of noise can be suppressed in addition to the effect obtained in the second embodiment.

Figure 14B:
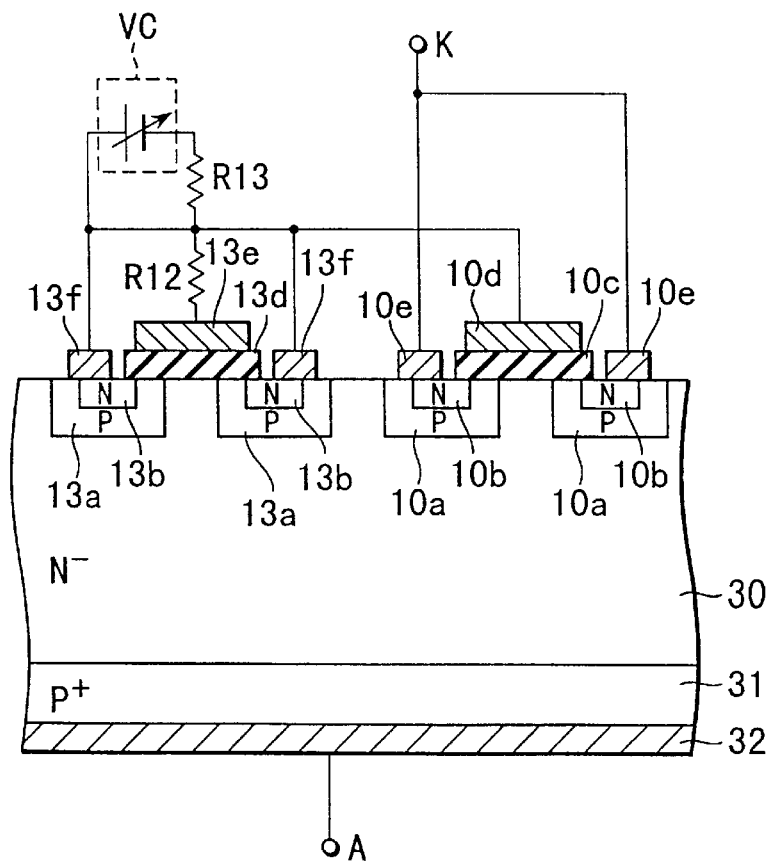

FIG. 14B is a cross sectional view showing the structure of a modification of the protection circuit according to this embodiment.

In this modification, a resistor R13 and a variable power supply VC are connected in series between the gate electrode 13e and the source electrode 13f. If a bias voltage applied between the gate electrode 13e and the source electrode 13f is changed by use of the variable power supply VC, the threshold voltage of the electric field to turn ON the MOSFET is substantially changed, though there is no p-shield layer 13c of the device shown in FIG. 14A. Therefore, the preset value of the surge voltage can be changed by changing the bias voltage applied to the electric field sensing element ED13 from the variable power supply VC. In light of tests and maintenance of the power converting system, it is preferable that the operation for changing the voltage of the variable power supply VC can be easily performed from the exterior of the package, in which the main semiconductor switch and protection circuit are received.

(Fourth Embodiment)

FIG. 15 is a construction diagram showing part of a power converting system according to a fourth embodiment of the present invention. FIG. 16 is a construction diagram showing a protection circuit applied to this device which is a modification of the first embodiment.

The protection circuit P of the semiconductor device includes an excessive current protection section P2 for protection from the excessive current in addition to the excessive voltage clamp section P1. The excessive current protection section P2 is connected in parallel with the excessive voltage clamp section P1 between the anode terminal A and the cathode terminal K and is connected to the gate terminal G.

The operation of the above semiconductor device is explained below. However, the excessive voltage clamp section is the same as described before and the explanation therefor is omitted.

In the ON state, a main current flows in the IGBT 1 and a small current for excessive current detection flows in the excessive current protection section P2. When the small current for excessive current detection exceeds a preset value, the excessive current protection section P2 detects an excessive current, and short-circuits the potential of the gate terminal G of the IGBT 1 to the potential of the cathode terminal K to set the IGBT 1 into the OFF state. Thus, when the excessive current occurs, the whole semiconductor device can be safely turned OFF.

That is, if an excessive current exceeding the current normally used in the switching element flows, the excessive current protection circuit detects the excessive current and controls the potential of the gate terminal G of the main IGBT. As a result, all of the main IGBTs connected in parallel can be simultaneously turned OFF, thereby protecting the main IGBTs from being destroyed by the excessive current.

According to this embodiment, the protection circuit P is realized to have the excessive current clamp section P1 and the excessive current protection section P2 integrated with each other, and include three terminals of the anode terminal A, cathode terminal K and gate terminal G. Thus, it can be extremely easily integrated with the IGBT or the main switching element.

For example, as shown in FIG. 15, the protection circuit P can be directly connected in parallel with the main IGBT 1. Further, as shown in FIG. 17, it can be connected in parallel with a plurality of main IGBTs 1 to n to protect all of the main IGBTs 1 to n. Further, the constructions which are the same as that of FIG. 17 can be connected in series as shown in FIG. 18. The semiconductor device having the protection circuit P and the main IGBTs 1 to n can be put into a package by adding gate wirings to the protection circuit P to the construction shown in FIGS. 5 and 6.

(Fifth Embodiment)

Figure 19:
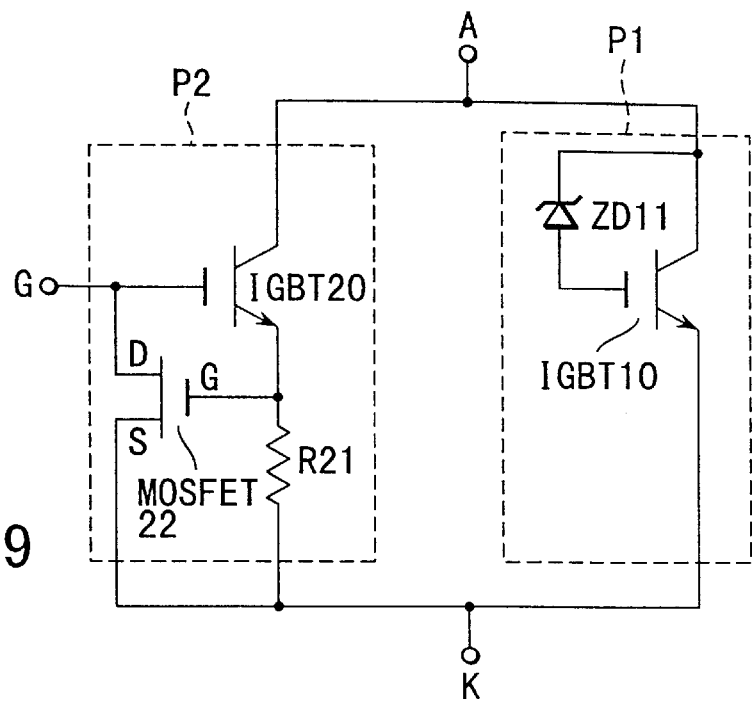
FIG. 19 is a circuit diagram showing a protection circuit according to a fifth embodiment.

FIG. 19 is a circuit diagram showing a protection circuit according to a fifth embodiment of the present invention.

This embodiment relates to a specific construction of the excessive current protection section P2. As shown in FIG. 19, the excessive current protection section P2 has an IGBT 20 which is an excessive current protection switching element. A resistor R21 is connected between the emitter of the IGBT 20 and the cathode terminal K of the protection circuit P2. Further, the excessive current protection section P2 has a MOSFET 22 which is an excessive current detection switching element. The gate of the MOSFET 22 is connected between the emitter of the IGBT 20 and the resistor R21, the drain electrode thereof is connected to the gate of the IGBT 20 and the source electrode thereof is connected to the cathode terminal K.

Figure 20:
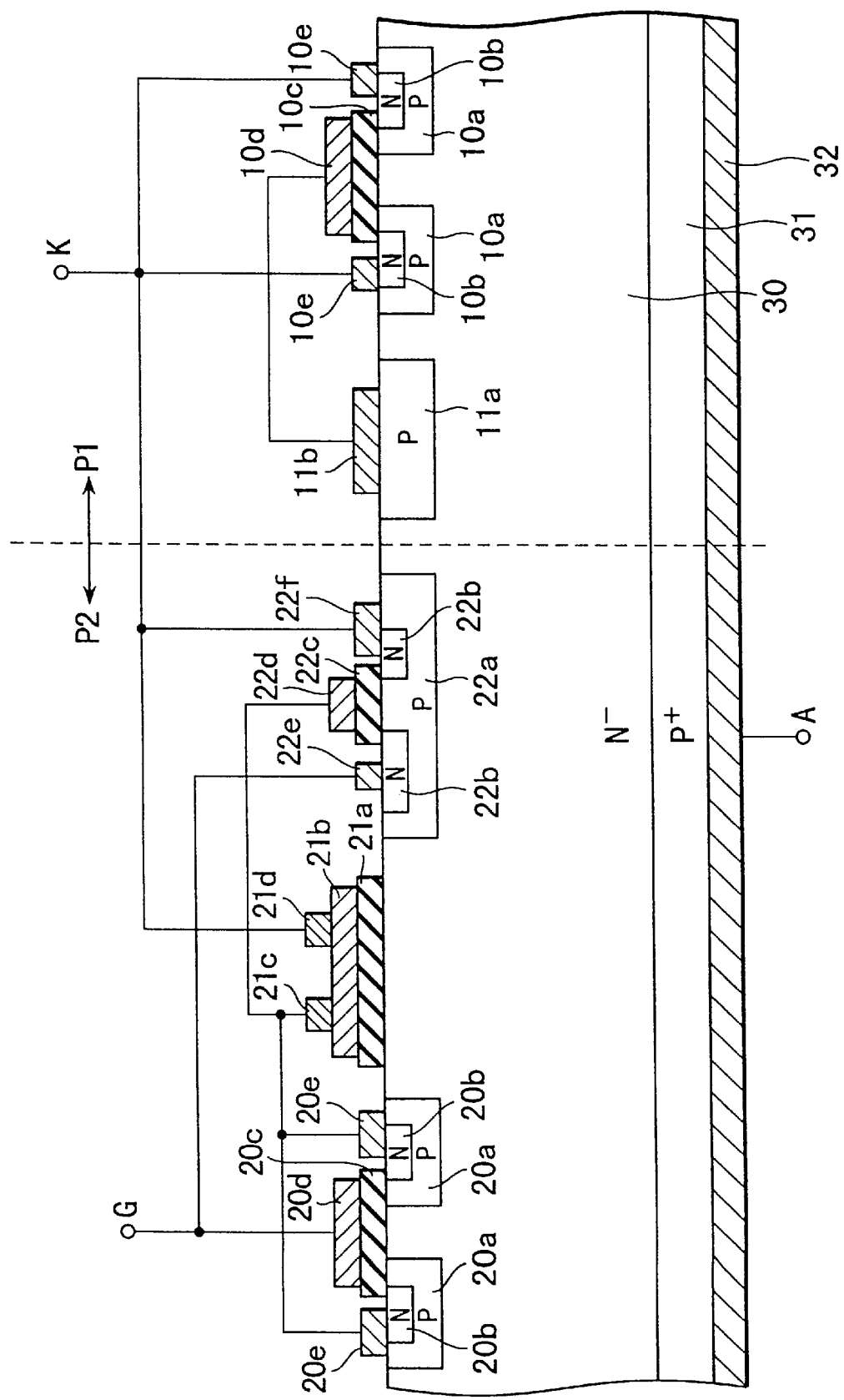
FIG. 20 is a cross sectional view showing the construction obtained in a case where the protection circuit of the fifth embodiment is formed on one substrate.

FIG. 20 is a cross sectional view showing a structure obtained when the protection circuit of this embodiment is formed on one substrate.

Like the excessive voltage clamp section P1, in the excessive current protection section P2, a p-emitter layer 31 and an anode electrode 32 are formed in and on one of the surfaces of an n-base layer 30, respectively. A plurality of p-base layers 20a and a well layer 22a are selectively formed in the other surface of the n-base layer 30. Further, n-layers 20b and 22b are selectively formed in the surfaces of the p-base layers 20a and p-well layer 22a. Two p-base layers 20a, in the surface of which the n-layers 20b are respectively and selectively formed, correspond to the IGBT 20. The p-well layer 22a, in the surface of which the two n-layers 22b are selectively formed, corresponds to the MOSFET 22.

In the IGBT 20, a gate electrode 20d of the IGBT 20 is formed on the surfaces of portions of the p-base layers 20a and n-base layer 30 which are sandwiched between the adjacent n-layers 20b with an insulating layer 20c formed therebetween. The gate electrode 20d is connected to the gate terminal G of the protection circuit and the n-layer 22b corresponding to the drain of the MOSFET 22. Emitter electrodes 20e of the IGBT 20 are formed on both sides of the insulating layer 20c and each formed in contact with the corresponding p-base layer 20a and n-layer 20b.

In the MOSFET 22, a gate electrode 22d is formed on the surface of a portion of the p-well layer 22a which is sandwiched between the adjacent n-layers 22b with an insulating layer 22c formed therebetween. One U of the n-layers 22b which corresponds to the drain is connected to the gate terminal G of the protection circuit P and the gate electrode 20d of the IGBT 20 via the drain electrode 22e formed on the n-layer. The other n-layer 22b corresponding to the source is connected to the cathode terminal K of the protection circuit P via the source electrode 22f formed on the n-layer.

A resistor 21b formed of polysilicon or the like which corresponds to the resistor R21 is formed on the n-base layer 30 with an insulating layer 21a disposed therebetween. One end of the resistor 21b is electrically connected to the emitter electrode 20e of the IGBT 20 and the gate electrode 22d of the MOSFET 22 via the electrode 21c. The other end of the resistor 21b is connected to the cathode terminal K of the protection circuit P and the source electrode 22f of the MOSFET 22 via the cathode electrode 21d.

The operation of the semiconductor device with the above construction is explained below. However, the excessive voltage clamp section is the same as described before and the explanation therefor is omitted.

In the excessive current protection section P2, when a small current for excessive current detection exceeds a preset value, the MOSFET 22 is turned ON. Therefore, all of the gates of the protection IGBT 20 and the IGBTs 1 to n of the main switching element are short-circuited to the cathode terminal K. Thus, all of the main IGBTs 1 to n are turned OFF and protected from being destroyed by the excessive current.

According to this embodiment, as shown in FIG. 19, the effect of the fourth embodiment can be stably and easily attained by constructing the excessive current protection section P2 by a combination of the IGBT 20 and the MOSFET 22. As shown in FIG. 20, the protection circuit of this embodiment can be formed on one chip of the semiconductor device. Therefore, it is suitable for a high-power converting system which is required to have a large number of elements of series-parallel circuits.

(Sixth Embodiment)

Figure 21:
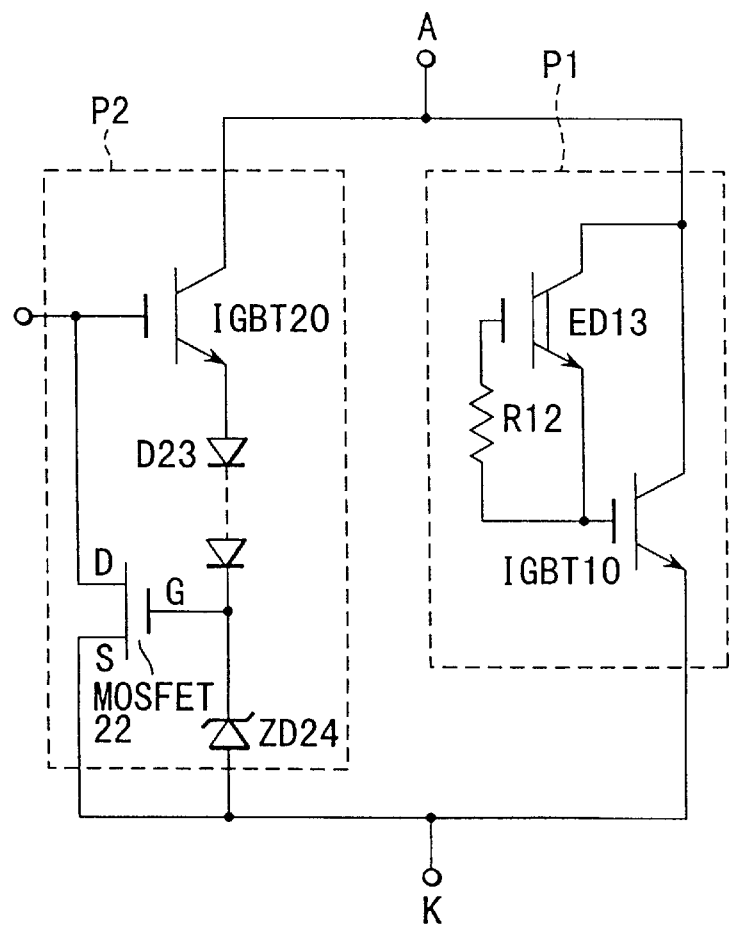
FIG. 21 is a circuit diagram showing a protection circuit according to a sixth embodiment.

FIG. 21 is a circuit diagram showing a protection circuit according to a sixth embodiment of the present invention, which is a modification of FIG. 19.

An excessive current protection section P2 of the protection device P in this embodiment has a plurality of diodes D23 connected in a forward direction between the emitter of the IGBT 20 and the gate of the MOSFET 22. Further, it includes a Zener diode ZD24 connected in a reverse direction between the gate of the MOSFET 22 and the cathode terminal K of the protection circuit P, instead of the resistor R21.

Figure 22:
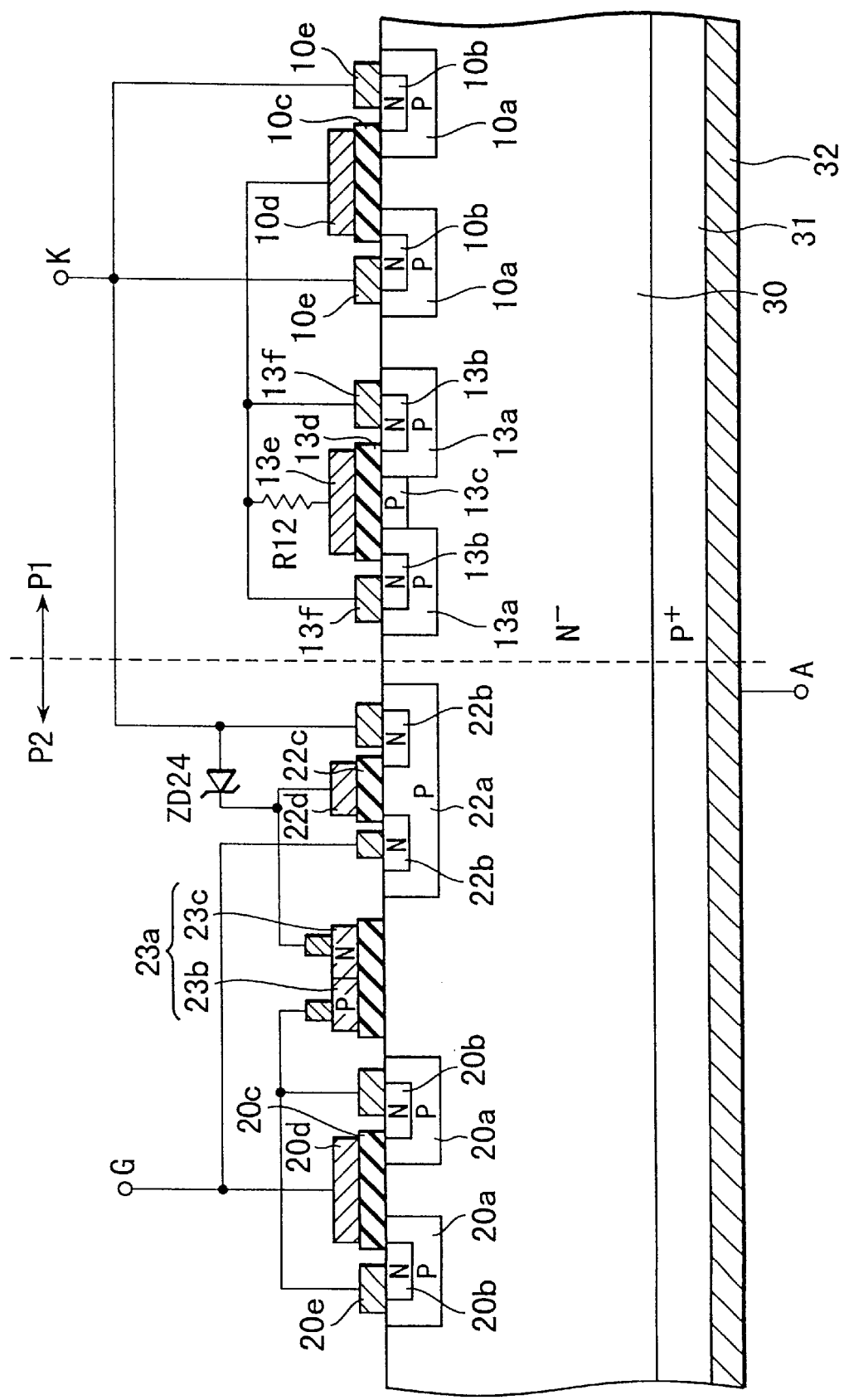
FIG. 22 is a cross sectional view showing the construction obtained in a case where the protection circuit of the sixth embodiment is formed on one substrate.

FIG. 22 is a cross sectional view showing a structure obtained in a case where the protection circuit of this embodiment is formed on one substrate.

In the excessive current protection section P2, a pn junction 23a corresponding to the diode D23 is formed of polysilicon or the like, instead of the resistor 21b corresponding to the resistor R21. A p-portion 23b of the pn junction 23a is connected to the emitter electrodes 20e of the IGBT 20. An n-portion 23c of the pn junction 23a is connected to the gate electrode 22d of the MOSFET 22. The Zener diode ZD24 is connected in a reverse direction between the gate electrode 22d of the MOSFET 22 and the cathode terminal K of the protection circuit P.

The operation of the semiconductor device with the above construction is explained below.

In the excessive current protection section P2, a voltage corresponding to a small current for excessive current detection is applied to the gate of the MOSFET 22 by the diodes D23 and Zener diode ZD24. When the small current for excessive current detection exceeds a preset value, the Zener diode ZD24 is broken down and the MOSFET 22 is turned ON. As a result, the gates of all of the IGBT 20 for excessive current detection and IGBTs 1 to n of the main switching elements are short-circuited to the cathode terminal K, thereby turning OFF the IGBTs 1 to n of the main switching elements.

Therefore, according to this embodiment, the same effect as that in the fifth embodiment can be attained. In the fifth and sixth embodiments, a combination of the excessive voltage clamp section P1 and the excessive current protection section P2 can be freely and variously modified. For example, the excessive voltage clamp section P1 of the sixth embodiment and the excessive current protection section P2 of the second embodiment can be combined. Further, the excessive current protection section P2 of the sixth embodiment and the excessive voltage clamp section P1 of the second embodiment can be combined.

Further, since the excessive voltage clamp section P1 and the excessive current protection section P2 in the fifth and sixth embodiments independently perform the protection operation, it is not necessary to simultaneously provide the two sections, but a desired one of the two sections can be selectively provided. In this case, the voltage protection function or current protection function corresponding to the omitted section cannot be attained, but the necessary function can be attained as the protection function of the provided section.

(Seventh Embodiment)

FIG. 23 is a circuit diagram showing part of a power converting system according to a seventh embodiment of the present invention, which is a modification of the construction shown in FIG. 9.

In this embodiment, a protection function for preventing dv/dt destruction occurring at the turn-OFF time is provided in addition to the excessive voltage protection function given by the Zener diode described before. As the main switching element, a GTO is used instead of the main IGBT. More specifically, in order to attain the protection function for preventing dv/dt destruction, there is used a protection circuit having a capacitor C1 and a diode D1 serially connected in the forward direction between the anode and cathode of the GTO and a resistor R1 connected in parallel with the diode D1.

In the protection circuit, the capacitor C1 is discharged in the ON state and charged according to the time constant of the capacitor C1 and a circuit inductance Lm at the turn-OFF time. Therefore, the voltage rise rate dv/dt can be suppressed to protect the GTO from dv/dt destruction.

According to this embodiment, since the protection function for preventing dv/dt destruction at the turnOFF time is provided in addition to the function of protection from the excessive voltage destruction, the main switching element can be protected from both of the excessive voltage destruction and dv/dt destruction. Note that the capacitor C1 is used for the protection not from the excessive voltage destruction, but from the dv/dt destruction, and thus is allowed to have a small capacitance. The protection circuit for protection from the dv/dt destruction in this embodiment can be modified to have the construction in which the capacitor C1 is directly connected in parallel with the GTO by omitting the diode D1 and resistor R1 shown in FIG. 23.

(Eighth Embodiment)

FIG. 24 is a schematic perspective view showing part of a power converting system according to an eighth embodiment of the present invention.

In this embodiment, a cooling function is added to the construction shown in FIG. 9. More specifically, as shown in FIG. 24, a main IGBT 1, Zener diode ZD11 and protection IGBT 10 are mounted on a cooling fin 42 used as a common cooling unit or heat sink and they are received into a single package 43. The main IGBT 1 and protection IGBT 10 may be formed on the same chip or formed on different chips and put into the same package.

With the above construction, the effect for reducing heat generated by loss occurring at the time of turn-OFF, turn-ON or energization of the main IGBT 1 can be attained in addition to the effect of the second embodiment. Further, in the Zener diode ZD11 and protection IGBT 10 used in the non-saturated area, heat generated by loss caused by passing a current while applying a voltage can be reduced. The IGBT 1 and protection circuit are received into the same package 43 together with the same cooling fin 42 and they can be realized in a compact form. Therefore, it is possible to reduce the size of the power converting system using them.

This embodiment is not limited to the main IGBT 1 and protection IGBT 10 of single chip. As shown in FIG. 25, main IGBTs 1 and 2 and protection IGBTs $10_1$ and $10_2$ of multi-chip can be received into a single package 43 together with the single cooling fin 42.

(Ninth Embodiment)

FIG. 26 is a circuit diagram showing part of a power converting system according to a ninth embodiment of the present invention.

This embodiment is a modification of the construction shown in FIG. 24. More specifically, a first cooling fin $42_1$ for cooling the main IGBT 1 and a second cooling fin $42_2$ for cooling the protection IGBT 10 are used instead of the single cooling fin 42. Thus, the cooling ability can be increased by using the separate cooling fins $42_1$ and $42_1$. Therefore, the effect of increasing the main current (or interruption current) in the main IGBT I can be attained in addition to the effect of the eighth embodiment. Further, a power converting system of large capacity can be attained by use of them.

The main IGBT 1 and protection IGBT 10 play different roles, and thus the amounts of heat generated therefrom are different. In light of this fact, cooling units for the different amounts of heat can be provided, so that the cooling operation can be efficiently effected. Further, since the cooling ability can be enhanced, high-frequency switching can be attained.

(Tenth Embodiment)

Figure 27:
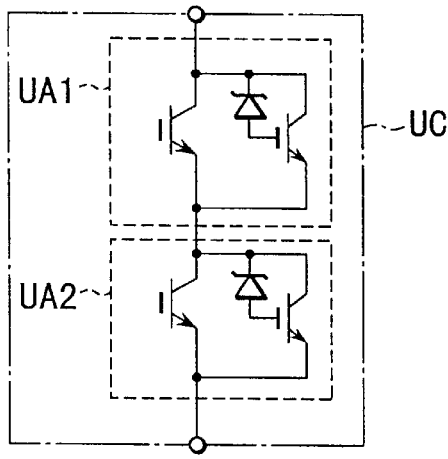
FIG. 27 is a circuit diagram showing part of a power converting system according to a tenth embodiment of the present invention.

FIG. 27 is a circuit diagram showing part of a power converting system according to a tenth embodiment of the present invention.

This embodiment is a modification of the construction shown in FIG. 8 (FIG. 9). In order to attain a large current, a semiconductor device UB is constructed by connecting semiconductor devices UA shown in FIG. 8 (FIG. 9) in parallel as shown in FIG. 27.

In the conventional snubber circuit, the current becomes unbalanced if the main IGBTs 1 are connected in parallel. Therefore, in part of the IGBTs 1, a current is concentrated and a large current is interrupted and, as a result a high surge voltage may be generated, thereby causing destruction by the excessive voltage.

On the other hand, according to the protection IGBT of the present invention, the surge voltage can be suppressed to a preset value irrespective of the magnitude of the interruption current or the characteristic of the main IGBT 1. Therefore, there is no possibility that destruction by the excessive voltage will occur even if the current becomes unbalanced due to parallel connection.

According to this embodiment, as shown in FIG. 27, a large-current power converting system can be attained by parallel connection in addition to the effect of the second embodiment. Further, since the surge voltage occurring in the case of series connection or parallel connection is set to a constant value even if the characteristics of the main switching elements are different, the yield of the main switching elements used in the series-connection circuit or parallel-connection circuit can be enhanced and the cost thereof can be lowered. Also, a single switch circuit having a combination of the main switching element and the protection circuit or a switch circuit unit obtained by connecting the single switch circuits in series or parallel can be standardized. Therefore, it becomes possible to lower the cost of a power converting system using an inverter constructed by use of a standardized unit or units.

(Eleventh Embodiment)

Figure 28:
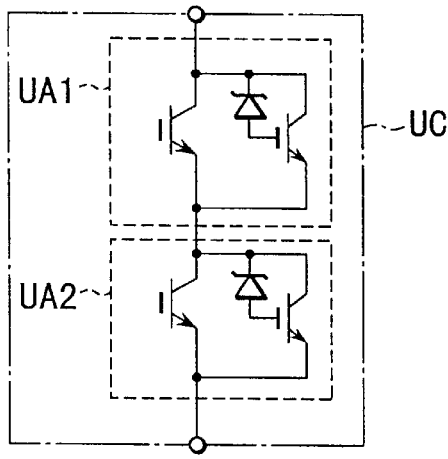
FIG. 28 is a circuit diagram showing part of a power converting system according to an eleventh embodiment of the present invention.

FIG. 28 is a circuit diagram showing part of a power converting system according to an eleventh embodiment of the present invention.

This embodiment is a modification of the construction shown in FIG. 8 (FIG. 9). In order to attain a high operation voltage, a semiconductor device UC is constructed by connecting semiconductor devices UA shown in FIG. 8 (FIG. 9) in series as shown in FIG. 28.

In the conventional snubber circuit, in a case where the main IGBTs 1 to n of the main switching elements are connected in series, the turn-OFF operation of part of the main switching elements may be started earlier than the other main switching elements at the turn-OFF time since the characteristics of the main switching elements are different. In this case, the whole circuit voltage is applied to the main switching element which earlier starts the turn-OFF operation at the turn-OFF time and destruction due to the excessive voltage will occur. By taking this into consideration, conventionally, an attempt is made to make the characteristics of the main switching elements equal to one another in order to set the turn-OFF timings of the main switching elements equal to one another. This lowers the yield of the main switching elements and raises the cost thereof.

On the other hand, according to the present invention, since the voltage applied to the main switching element can be suppressed to a preset value or less by use of the protection circuit even when part of the main switching elements earlier start the turnOFF operation, destruction by the excessive voltage can be prevented.

According to this embodiment, in addition to the effect of the second embodiment, the surge voltage applied to the series-connected main switching elements can be kept constant irrespective of the characteristics of the main switching elements. Therefore, the yield of the main switching elements can be enhanced and the cost thereof can be lowered. Thus, a high-voltage switch can be attained and a high-voltage power converting system can be easily attained at low cost. Further, unlike the conventional charging/discharging snubber circuit, the protection circuit has only a function of suppressing the excessive voltage and includes no capacitor for suppressing dv/dt, thereby preventing an increase in the loss due to the presence of the capacitor. Therefore, the protection circuit of low loss for series connection can be attained.

(Twelfth Embodiment)

Figure 29:
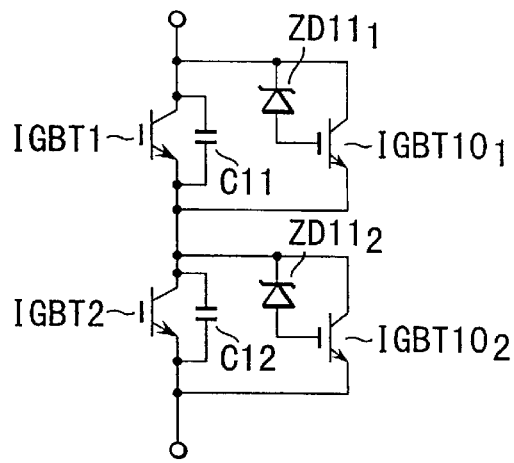
FIG. 29 is a circuit diagram showing part of a power converting system according to a twelfth embodiment of the present invention.

FIG. 29 is a circuit diagram showing part of a power converting system according to a twelfth embodiment of the present invention.

This embodiment is a modification of the construction shown in FIG. 28, especially when the number of series connections is large, wherein the modification is additionally provided with a dv/dt suppressing function. More specifically, capacitors C11 and C12 are respectively connected between the collectors and emitters of main IGBTs 1 and 2. If the main IGBTs 1 and 2 of the main switching elements are connected in series, an excessive voltage occurring at the turn-OFF time can be suppressed to a preset value, but the load of part of the protection circuits becomes larger, thus the loss becomes larger and the load of cooling of part of the protection circuits becomes larger. In this embodiment, in order to cancel the unbalance of the loads of the protection circuits by taking the above fact into consideration, the capacitors C11 and C12 are connected in parallel with the main IGBTs 1 and 2 as shown in FIG. 29.

That is, in this embodiment, dv/dt of the main IGBTs 1 and 2 at the turn-OFF time is suppressed by use of the capacitors C11 and C12 to prevent the circuit voltage from being abruptly applied to the main switching element which earlier starts the turn-OFF operation. Thus, a period of the voltage unbalance can be slightly reduced and a period in which the application voltage of the main switching element is clamped at a preset level can be reduced in addition to the effect of the eleventh embodiment. Therefore, the unbalance of the losses generated in the protection circuits can be alleviated and the unbalance of cooling can be reduced.

Figure 30:
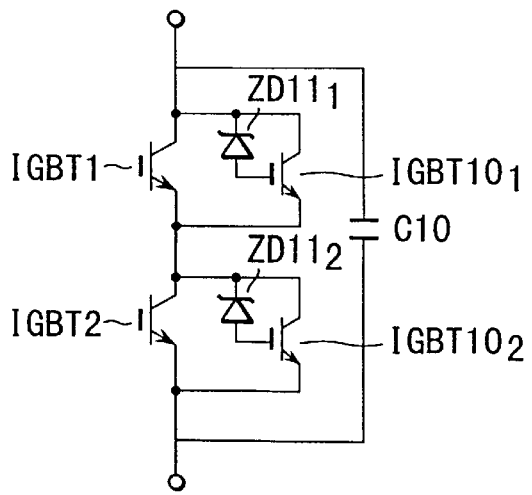
FIG. 30 is a circuit diagram showing a modification of the twelfth embodiment.
Figure 35:
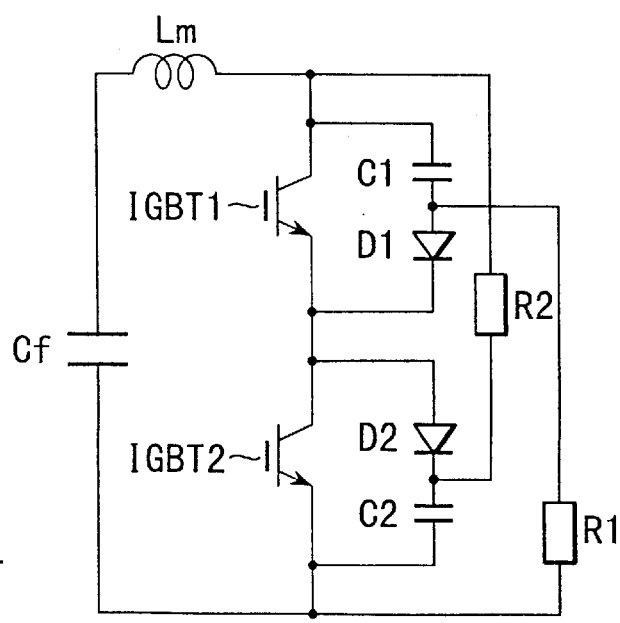
FIG. 35 is a circuit diagram showing a conventional clamp type snubber circuit.
Figure 36:
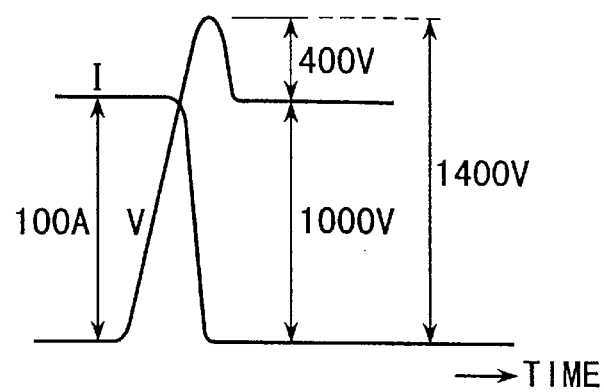
FIG. 36 is a waveform diagram for illustrating the operation of the conventional clamp type snubber circuit.
Figure 37:
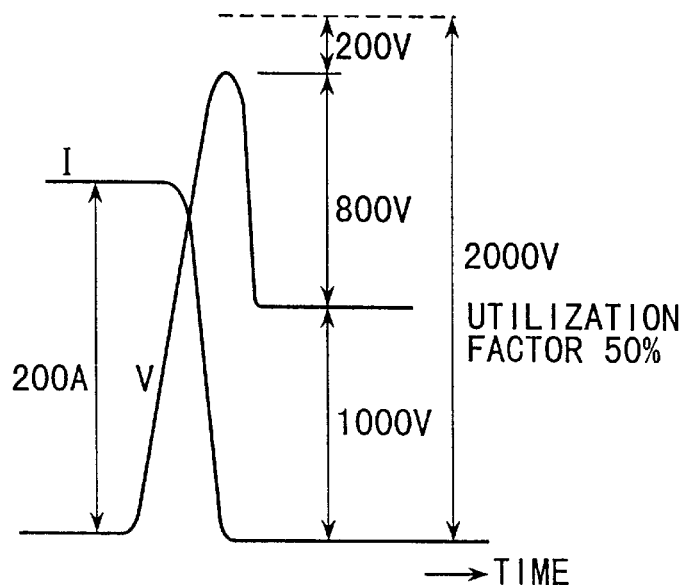
FIG. 37 is a waveform diagram for illustrating the operation of the conventional clamp type snubber circuit.

The capacitors C11 and C12 of this embodiment have roles different from the role of the capacitor C1 used for preventing dv/dt destruction as described with reference to FIG. 23. Therefore, the capacitances of the capacitors C11 and C12 can be made smaller than those of the capacitors C1 and C2 of the conventional snubber circuit shown in FIG. 35, so that the capacitor loss is reduced. In this embodiment, as shown in FIG. 30, the construction can be modified by connecting one capacitor C10 between the collector and emitter of the main switching element string instead of the capacitors C11 and C12 respectively provided for the main IGBTs 1 and 2.

(Thirteenth Embodiment)

Figure 31:
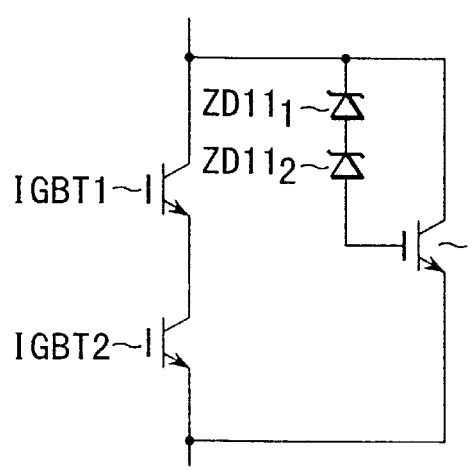
FIG. 31 is a circuit diagram showing part of a power converting system according to a thirteenth embodiment of the present invention.

FIG. 31 is a circuit diagram showing part of a power converting system according to a thirteenth embodiment of the present invention.

This embodiment is a modification of the construction shown in FIG. 9. In order to attain a high breakdown voltage, main IGBTs 1 and 2 are serially connected and Zener diodes $ZD11_1$ and $ZD11_2$ are serially connected. That is, the series-connected IGBTs 1 and 2 are regarded as one large IGBT and a protection circuit is provided for the IGBT.

With this construction, like the second embodiment, the surge voltage generated at the turn-OFF time can A be suppressed to a preset value or less. In this embodiment, the number of protection circuits can be reduced in comparison with the case of the twelfth embodiment in which the protection circuits are respectively provided for the series-connected main IGBTs 1 and 2. Thus, the high-voltage switch and high-voltage power converting system can be attained in a compact form.

Figure 32:
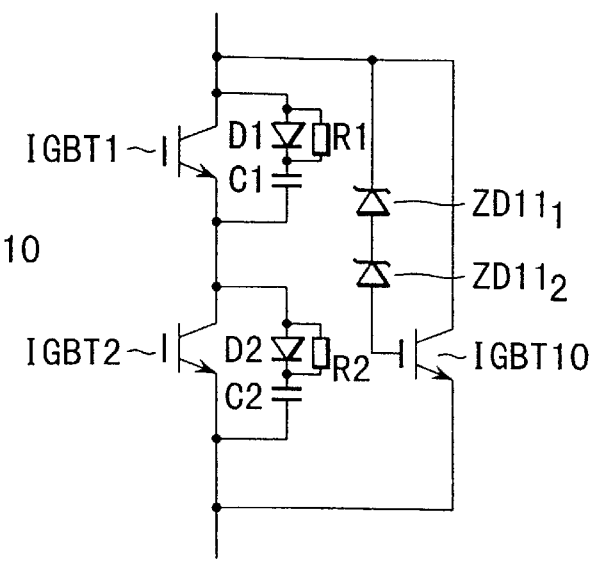
FIG. 32 is a circuit diagram showing a modification of the thirteenth embodiment.

Even if the surge voltage of a large portion occurring at the turn-OFF time is suppressed to the preset value or less by use of the protection circuit of this embodiment, the surge voltage caused by the wiring inductance Lm provided near the individual main IGBTs 1 and 2 may be raised to a level which cannot be neglected in some cases. In this case, as shown in FIG. 32, a conventional snubber circuit of small capacity with a simple construction or the protection circuit of the present invention can be provided near the individual IGBTs 1 and 2.

(Fourteenth Embodiment)

Figure 33:
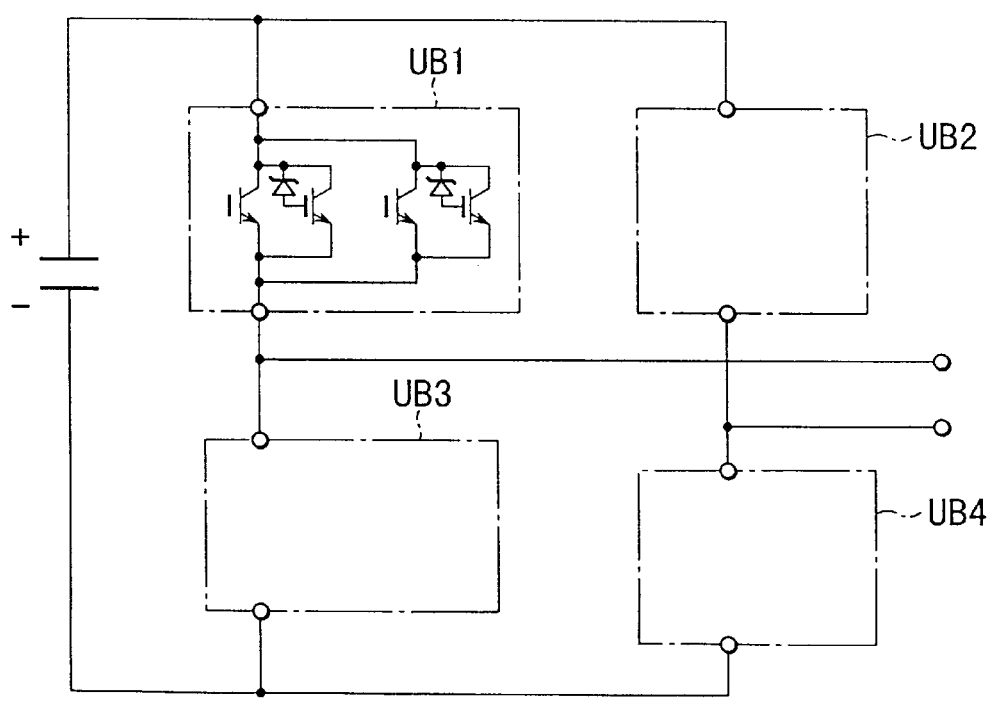
FIG. 33 is a circuit diagram showing a power converting system according to a fourteenth embodiment of the present invention.

FIG. 33 is a circuit diagram showing a power converting system according to a fourteenth embodiment of the present invention.

Figure 34:
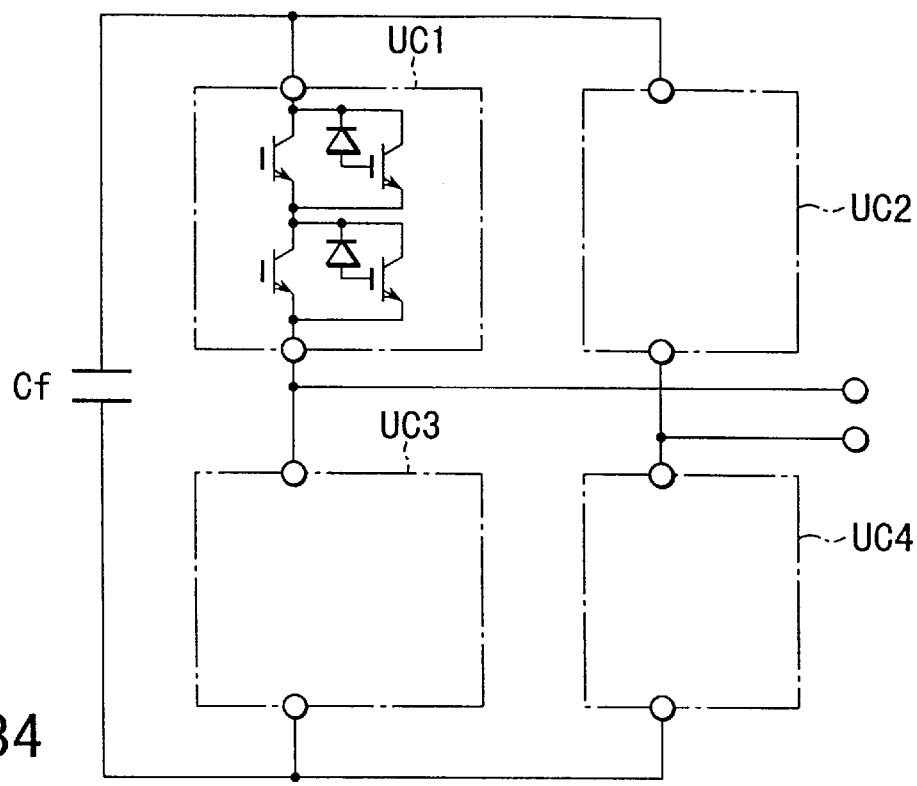
FIG. 34 is a circuit diagram showing a modification of the fourteenth embodiment.

This embodiment is a modification of the construction shown in FIG. 27. More specifically, the semiconductor devices UB used as the parallel-connected switches (large-current switches) shown in FIG. 27 are connected in a series-parallel form to provide a large-current converting system. With this construction, the high-voltage large-current converting system which is free from a problem caused by the surge voltage can be attained in addition to the effect of the tenth embodiment. Further, as shown in FIG. 34, this embodiment can be modified such that the semiconductor devices UC used as series-connected switches (highvoltage switches) shown in FIG. 28 are connected in a series-parallel form to provide a high-voltage converting system.

(Other Embodiments)

In each of the above embodiments, IGBT or GTO is used as the switching element, but the present invention is not limited to these embodiments and any power switching element such as a MOSFET, thyristor, SIT, MESFET, SIThy, IEGT can be used as the main switching element or the switching element of the protection circuit, instead of the IGBT. Further, the present invention can be applied to various main switching elements such as a planer structure, trench structure, mesa structure, or inverted mesa structure. The structure of the main switching element may be formed of vertical type or lateral type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor protection device for suppressing an application voltage containing a surge voltage to a preset value or less, the surge voltage occurring at a turn-OFF phase of a main semiconductor switch having first and second main electrodes and a control electrode, said protection device comprising:

a switching element configured to form a bypass which is connected in parallel with said main semiconductor switch and opened/closed depending on said preset value, said switching element having first and second terminals arranged to be respectively connected to said first and second main electrodes and a control terminal configured to control conduction of a path between said first and second terminals; and a voltage setting element connected to said control terminal and configured to set said preset value, wherein said voltage setting element sets said preset value to 100% to 150% of a circuit voltage applied between said first and second main electrodes, and applies a voltage caused by energy of the application voltage to said control terminal when the application voltage exceeds said preset value, to make said path between said first and second terminals conductive so as to open said bypass parallel with said main semiconductor switch, and wherein said voltage setting element includes an electric field sensing element connected between said first main electrode and said control terminal, said electric field sensing element including a first semiconductor region, an input electrode connected to said first semiconductor region and said first main electrode, and an output electrode disposed on said first semiconductor region through an insulating film and connected to said control terminal, such that said first semiconductor region is depleted by use of an electric field generated by the application voltage and applied through said input electrode, and thus said output electrode forms a capacitive coupling with said input electrode to apply a voltage caused by energy of the application voltage to said control terminal, when the application voltage exceeds said preset value.

2. The device according to claim 1, wherein said switching element has a MOS structure having a gate used as said control terminal.

3. The device according to claim 2, wherein said switching element includes an IGBT and said first and second terminals and said control terminal correspond to a collector, emitter and gate of said IGBT.

4. The device according to claim 1, wherein said voltage setting element is capable of changing said preset value.

5. The device according to claim 4, wherein said voltage setting element further includes a variable power supply connected to said electric field sensing element, and said variable power supply is capable of changing said preset value by changing a bias voltage applied to said electric field sensing element.

6. The device according to claim 1, wherein said main semiconductor switch is turned ON/OFF at 50 Hz to 20 kHz.

7. The device according to claim 1, further comprising an excessive current protection section connected in parallel with said main semiconductor switch and said switching element, said excessive current protection section including a switching element for turning OFF said main semiconductor switch when a current flowing in said main semiconductor switch exceeds a current threshold value.

8. The device according to claim 7, wherein said switching element of said excessive current protection section short-circuits said second main electrode to said control electrode to turn OFF said main semi-conductor switch when the current flowing in said main semiconductor switch exceeds said current threshold value.

9. The device according to claim 1, wherein said switching element and said voltage setting element are arranged on one semiconductor substrate.

10. The device according to claim 1, wherein said main semiconductor switch, said switching element and said voltage setting element are arranged on one semiconductor substrate.

11. The device according to claim 1, wherein said device is configured to handle said surge voltage occurring substantially at each turn-OFF phase of said main semiconductor switch.

12. A power converting system comprising a plurality of switching circuits connected in parallel or in series, each of said switching circuits comprising:
   a main semiconductor switch having first and second main electrodes and a control electrode; and
   a semiconductor protection device configured to suppress an application voltage containing a surge voltage to a preset value or less, the surge voltage occurring at a turn-OFF phase of said main semiconductor switch,
   wherein said protection device includes:
   a switching element configured to form a bypass which is connected in parallel with said main semiconductor switch and opened/closed depending on said preset value, said switching element having first and second terminals arranged to be respectively connected to said first and second main electrodes and a control terminal configured to control conduction of a path between said first and second terminals, and
   a voltage setting element connected to said control terminal and configured to set said preset value,
   wherein said voltage setting element sets said preset value to 100% to 150% of a circuit voltage applied between said first and second main electrodes, and applies a voltage caused by energy of the application voltage to said control terminal when the application voltage exceeds said preset value, to make said path between said first and second terminals conductive so as to open said bypass parallel with said main semiconductor switch, and
   wherein said voltage setting element includes an electric field sensing element connected between said first main electrode and said control terminal, said electric field sensing element including a first semiconductor region, an input electrode connected to said first semiconductor region and said first main electrode, and an output electrode disposed on said first semiconductor region through an insulating film and connected to said control terminal, such that said first semiconductor region is depleted by use of an electric field generated by the application voltage and applied through said input electrode, and thus said output electrode forms a capacitive coupling with said input electrode to apply a voltage caused by energy of the application voltage to said control terminal, when the application voltage exceeds said preset value.

13. The system according to claim 12, wherein said protection device further includes an excessive voltage rising rate protection section connected in parallel with said main semiconductor switch and said switching element, said excessive voltage rising rate protection section including a capacitor which is discharged/charged according to turn-ON/OFF of said main semiconductor switch.

14. The system according to claim 13, wherein said excessive voltage rising rate protection section further includes a rectifier element and a resistor connected in parallel with each other and connected between said first main electrode and said capacitor.

15. The system according to claim 13, wherein said main semiconductor switch comprises a thyristor.

16. The system according to claim 12, wherein said main semiconductor switch and said protection device of each of said switching circuits are received in a common package capable of being cooled.

17. The system according to claim 12, wherein said main semiconductor switch and said protection device of each of said switching circuits are received in different packages each capable of being cooled.

18. The system according to claim 12, wherein said main semiconductor switch includes a plurality of main switching elements connected in parallel.

19. The system according to claim 12, wherein said main semiconductor switch includes a plurality of main switching elements connected in series.

20. The system according to claim 19, further comprising capacitors respectively connected in parallel with said main semiconductor switches.

21. The system according to claim 19, further comprising a common capacitor connected in parallel with said main semiconductor switches.

22. The system according to claim 12, wherein said main semiconductor switches are turned ON/OFF at 50 Hz to 20 kHz.

23. The system according to claim 12, wherein said device is configured to handle said surge voltage occurring substantially at each turn-OFF phase of said main semiconductor switch.

* * * * *